United States Patent
Beard et al.

(10) Patent No.: US 12,480,045 B2
(45) Date of Patent: Nov. 25, 2025

(54) CHIRAL INDUCED SPIN SELECTIVITY ENABLING A ROOM TEMPERATURE SPIN POLARIZED LIGHT EMITTING DIODE

(71) Applicant: Alliance for Sustainable Energy, LLC, Golden, CO (US)

(72) Inventors: Matthew Craig Beard, Arvada, CO (US); Haipeng Lu, Hong Kong (CN); Yaxin Zhai, Changsha (CN); Young-Hoon Kim, Seoul (KR); Joseph Jonathan Berry, Boulder, CO (US); Joseph Matthew Luther, Boulder, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 930 days.

(21) Appl. No.: 17/650,582

(22) Filed: Feb. 10, 2022

(65) Prior Publication Data
US 2022/0251443 A1    Aug. 11, 2022

Related U.S. Application Data

(60) Provisional application No. 63/147,867, filed on Feb. 10, 2021.

(51) Int. Cl.
| | |
|---|---|
| C09K 11/66 | (2006.01) |
| B82Y 20/00 | (2011.01) |
| B82Y 40/00 | (2011.01) |
| H10K 50/115 | (2023.01) |
| H10K 50/80 | (2023.01) |
| H10K 85/50 | (2023.01) |
| H10K 102/00 | (2023.01) |

(52) U.S. Cl.
CPC .......... *C09K 11/665* (2013.01); *H10K 50/868* (2023.02); *H10K 85/50* (2023.02); *B82Y 20/00* (2013.01); *B82Y 40/00* (2013.01); *H10K 50/115* (2023.02); *H10K 2102/00* (2023.02)

(58) Field of Classification Search
CPC .... C09K 11/665; H10K 71/00; H10K 50/115; H10K 2102/00; B82Y 20/00; B82Y 40/00
USPC .................................................. 252/301.4 H
See application file for complete search history.

(56) References Cited

U.S. PATENT DOCUMENTS

2017/0358759 A1* 12/2017 Lee ........................ H10K 85/30

OTHER PUBLICATIONS

Ahn, J. et al., "A new class of chiral semiconductors: chiral-organic-molecule-incorporating organic-inorganic hybrid perovskites," RSC Materials Horizons, vol. 4, 2017, 6 pages.

Bourelle, S.A. et al., "How Exciton Interactions Control Spin-Depolarization in Layered Hybrid Perovskites," Nano Letters, vol. 20, 2020, 8 pages.

(Continued)

*Primary Examiner* — Anita Nassiri-Motlagh
(74) *Attorney, Agent, or Firm* — Neal S. Vickery

(57) ABSTRACT

Described herein are spin polarized light emitting diodes (LEDs) and methods of making the same. Spin polarization is achieved via chiral induced spin selectivity where, for example, a stereochemically active cation is included in a perovskite to form the conductive layer of an LED device. Advantageously, the devices and methods described herein allow for spin polarization at room temperature and without application of a magnetic field or ferromagnetic contacts, in contrast to other described spin selective LEDs.

18 Claims, 35 Drawing Sheets

(56) References Cited

OTHER PUBLICATIONS

Chen, J.Y. et al., "Efficient Spin-Light Emitting Diodes Based on InGaN/GaN Quantum Disks at Room Temperature: A New Self-Polarized Paradigm," Nano Letters, vol. 14, 2014, 8 pages.
Chen, X. et al., "Impact of Layer Thickness on the Charge Carrier and Spin Coherence Lifetime in Two-Dimensional Layered Perovskite Single Crystals," ACS Energy Letters, vol. 3, 2018, 7 pages.
Flederling, R. et al., "Injection and detection of a spin-polarized current in a light-emitting diode," Nature, vol. 402, Dec. 16, 1999, 4 pages.
Hanbicki, A.T. et al., "Efficient electrical spin injection from a magnetic metal/tunnel barrier contact into a semiconductor," Applied Physics Letters, vol. 80, No. 7, 2002, 3 pages.
Jana, M.K. et al., "Organic-to-inorganic structural chirality transfer in a 2D hybrid perovskite and impact on Rashba-Dresselhaus spin-orbit coupling," Nature Communications, vol. 11, 2020, 10 pages.
Lee, H-D et al., "Efficient Ruddlesden-Popper Perovskite Light-Emitting Diodes with Randomly Oriented Nanocrystals," Advanced Functional Materials, vol. 29, 2019, 9 pages.
Long, G. et al., "Spin control in reduced-dimensional chiral perovskites," Nature Photonics Letters, vol. 12, Sep. 2018, 7 pages.
Lu, H. et al., "Spin-dependent charge transport through 2D chiral hybrid lead-iodide perovskites," Science Advances, Physics, vol. 5, 2019, 7 pages.
Lu, H. et al., "Highly Distorted Chiral Two-Dimensional Tin Iodide Perovskites for Spin Polarized Charge Transport," Journal of the American Chemical Society, vol. 142, 2020, 11 pages.
Ma, J. et al., "Chiral 2D Perovskites with a High Degree of Circularly Polarized Photoluminescence," ACS Nano, vol. 13, 2019, 7 pages.
Nishizawa, N. et al., "Pure circular polarization electroluminescence at room temperature with spin-polarized light-emitting diodes," PNAS, vol. 114, No. 8, Feb. 21, 2017, 6 pages.
Odenthal, P. et al., "Spin-polarized exciton quantum beating in hybrid organic-inorganic perovskites," Nature Physics, vol. 13, Sep. 2017, 7 pages.
Ohno, Y. et al., "Electrical spin injection in a ferromagnetic semiconductor heterostructure," Nature, vol. 402, Dec. 16, 1999, 3 pages.
Wang, J. et al., "Spin-optoelectronic devices based on hybrid organic-inorganic trihalide perovskites," Nature Communications, vol. 10, 2019, 6 pages.
Yang, X. et al., "Detecting Chirality in Two-Terminal Electronic Nanodevices," Nano Letters, vol. 20, 2020, 7 pages.
Zhao, L. et al., "Electrical Stress Influences the Efficiency of $CH_3NH_3PbI_3$ Perovskite Light Emitting Devices," Advanced Materials Communication, vol. 29, 2017, 6 pages.
Zhao, Q. et al., "High efficiency perovskite quantum dot solar cells with charge separating heterostructure," Nature Communications, vol. 10, 2019, 8 pages.

* cited by examiner

A

A

E

CHIRAL INDUCED SPIN SELECTIVITY ENABLING A ROOM TEMPERATURE SPIN POLARIZED LIGHT EMITTING DIODE

CROSS-REFERENCE TO RELATED APPLICATIONS

This application claims priority from U.S. Provisional Patent Application No. 63/147,867, filed on Feb. 10, 2021, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

SUMMARY

Described herein are spin polarized light emitting diodes (LEDs) and methods of making the same. Spin polarization is achieved via chiral induced spin selectivity where, for example, a stereochemically active cation is included in a perovskite to form the conductive layer of an LED device. Advantageously, the devices and methods described herein allow for spin polarization at room temperature and without application of a magnetic field or ferromagnetic contacts, in contrast to other described spin selective LEDs.

In an aspect, provided is a light emitting diode (LED) comprising a perovskite conductive layer comprising stereochemically-selected cations, wherein the stereochemically-selected cations enable a spin-polarized light emitting diode capable of generating a circularly-polarized electroluminescence.

The LED may further comprise a perovskite nanocrystal emitting layer in electronic communication with the perovskite conductive layer. The LED may further comprise an anode layer in electronic communication with the perovskite conductive layer. The LED may further comprise a cathode layer in electronic communication with the perovskite nanocrystal emitting layer.

In an aspect, provided is a light emitting diode (LED) comprising: a) a metal-halide perovskite conductive layer comprising stereochemically-selected cations; b) a perovskite nanocrystal emitting layer in electronic communication with the metal-halide perovskite layer; c) an anode layer in electronic communication with the metal-halide perovskite layer; and d) a cathode layer in electronic communication with the perovskite nanocrystal emitting layer.

The perovskite conductive layer may comprise a metal-halide perovskite, for example, lead iodide. The stereochemically-selected cations may comprise R or S organic molecules, for example, R or S methylbenzylammonium. In embodiments, at least 75%, 80%, 85%, 90%, 95%, 99%, or optionally 99.9% of the stereochemically-selected cations are the same enantiomer.

The perovskite conductive layer may be solution processed. The perovskite nanocrystal emitting layer may comprise nanocrystals with an average diameter less than or equal to 100 nm, 50 nm, 25 nm, or optionally 10 nm. The perovskite nanocrystal emitting layer comprises $CsPbI$ nanocrystals, $CsPbBr$ nanocrystals or a combination thereof.

The perovskite conductive layer may comprise a perovskite of $A_2BX_4$, where A includes an R-form of a stereochemically-selected cation of at least one of:

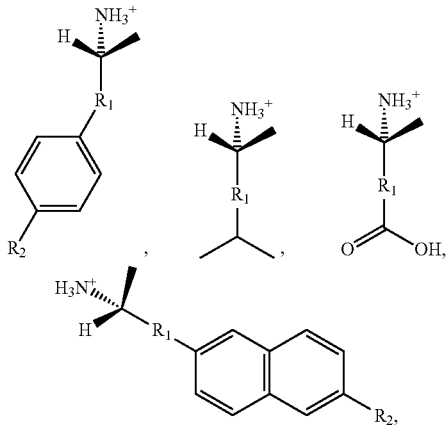

and/or an S-form of the stereochemically-selected molecule, B includes a cation, X includes an anion, $R_1$ includes a first carbon chain having between 2 and 5 carbon atoms, $R_2$ includes at least one of a hydrogen atom, a halogen atom, a carboxylic acid group, an alkoxy group, and/or a second carbon chain, and $R_3$ includes a third carbon chain.

The stereochemically-selected cation may comprise methylbenzylammonium (MBA), β-methylphenethylammonium, 1-methyl-3-phenylpropylammonium, 2-amino-5-methylhexane, 4-methoxy-α-methylbenzylammonium, 4-fluoro-α-methylbenzylammonium, 4-bromo-α-methylbenzylammonium, and/or alanine. In some embodiments of the present disclosure, the composition may demonstrate spin-polarization of charge transport when a current is injected into the composition.

The perovskite nanocrystal emitting layer may be deposited on a surface of the perovskite conductive layer via spin coating. The perovskite conductive layer may be deposited on a surface of the anode layer via spin coating. The perovskite conductive layer may be deposited on a surface of the anode layer to form a horizontally oriented organic/inorganic multiple quantum well configuration.

The anode layer may comprise indium tin oxide (ITO), modified poly(3,4-ethylenedioxythiophene) polystyrene-sulfonate, a perfluorinated polymeric ionomer or any combination thereof. The cathode layer may comprise LiF, Al or a combination thereof.

The spin-polarized light emitting diode may generate circularly-polarized electroluminescence at 25° C. The spin-polarized light emitting diode may generate circularly-polarized electroluminescence without application of a magnetic field or ferromagnetic contacts. The spin polarized light emitting diode may achieve a circularly-polarized electroluminescence having polarization greater than or equal to ±1.0%, ±2.0%, or optionally, ±2.5%.

The LED may further comprise an additive layer comprising 2,2',2-(1,3,5-benzinetriyl)-tris(1-phenyl-1-H-benzimidazole) (TPBI).

In an aspect, provided is a method of making any of the light emitting diode devices described herein.

BRIEF DESCRIPTION OF DRAWINGS

Some embodiments are illustrated in referenced figures of the drawings. It is intended that the embodiments and figures disclosed herein are to be considered illustrative rather than limiting.

(FIG. 1A) Schematic illustration of spin-polarized charge injection and CP-EL emission in spin-LEDs. (FIG. 1B) ToF-SIMS depth profile of m-PEDOT:PSS/CISS layer/CsPbI$_3$ NC heterostructure. (FIG. 1C) EL spectrum and operating device image (inset) of spin-LEDs based on CISS layer/CsPbI$_3$ NC heterostructure.

(FIG. 2A) Schematic illustration of mCP-AFM measurements of ITO/m-PEDOT:PSS/(R-/S-MBA)$_2$PbI$_4$/CsPbI$_3$ NC films. Current-voltage curves of (FIG. 2B) ITO/m-PEDOT:PSS/(R-MBA)$_2$PbI$_4$/CsPbI$_3$ NC films and (FIG. 2C) ITO/m-PEDOT:PSS/(S-MBA)$_2$PbI$_4$/CsPbI$_3$ NC films measured by mCP-AFM at room temperature and crystal structures of (R-/S-MBA)$_2$PbI$_4$ (inset). The current-voltage curves were measured 80 times from different spots on each sample. The bold lines are average results and shaded regions are 95% confidence limits for all average results. (FIG. 2D) The CP-EL spectra and (FIG. 2E) the EL polarization degree, P$_{CP-EL}$, of spin-LEDs based on CISS layer/CsPbI$_3$ NCs. (FIG. 2F) Temperature dependent average of |P$_{CP-EL}$| in spin-LEDs based on (S-MBA)$_2$PbI$_4$/CsPbI$_3$ NCs.

(FIG. 3A) Schematic illustration of hole injection through ITO/m-PEDOT:PSS (blue arrow), spin-polarized hole injection through CISS layer (yellow arrow), unpolarized electron injection through TPBI/LiF/Al (red arrow), spin dephasing (white arrow), and formation of mixed halide perovskites under the electric field and generation of CP-EL (dashed circle) in the spin-LEDs. (FIG. 3B) Left-handed and right-handed CP-EL spectrum of spin-LEDs based on (R-MBA)$_2$PbI$_4$/CsPbBr$_3$ NC heterostructure. (FIG. 3C) CP-EL and (FIG. 3D) P$_{CP-EL}$ of spin-LEDs based on CISS layer/CsPbBr$_3$ NC heterostructure.

(FIG. 4A) Transient absorption (TA) spectra of spin-LEDs before and under applied bias. The pump wavelength was selected at 400 nm. (FIG. 4B) Spin coherence lifetime of CsPb(Br$_{0.1}$I$_{0.9}$)$_3$ NC and CsPbI$_3$ NC films measured at different excitation carrier density. The dashed lines are fitted curves of carrier density dependent spin-lifetime by using a conventional power law. Spin coherence dynamics in (FIG. 4C) CsPb(Br$_{0.1}$I$_{0.9}$)$_3$ NC films and (D) CsPbI$_3$ NC films measured at different excitation carrier density. Inset in (FIG. 4D) is the mechanism of spin coherence lifetime measurement. Pump σ$_+$ has angular momentum of |+1> and generates a m$_j$ polarization, while pump σ$_-$ does the opposite. The probe σ$_+$ pulse selectively detects the change in spin polarization. The flip of a spin will simultaneously lead to a decay of the σ$_+$ bleach and a formation of the σ$_-$ bleach.

(FIG. 7D) Bias-dependent EL spectrum of spin-LEDs based on (R-MBA)$_2$PbI$_4$ PC films.

(FIG. 17A) 7.0×10$^{17}$ cm$^{-3}$, (FIG. 17B) 8.4×10$^{16}$ cm$^{-3}$, (FIG. 17C) 1.4×10$^{16}$ cm$^{-3}$ and (FIG. 17D) 1.7×10$^{15}$ cm$^{-3}$.

(FIG. 18A) 7.0×10$^{17}$ cm$^{-3}$, (FIG. 18B) 8.4×10$^{16}$ cm$^{-3}$, (FIG. 18 C) 1.4×10$^{16}$ cm$^{-3}$ and (FIG. 18D) 1.7×10$^{15}$ cm$^{-3}$.

REFERENCE NUMERALS

Figure 1A:
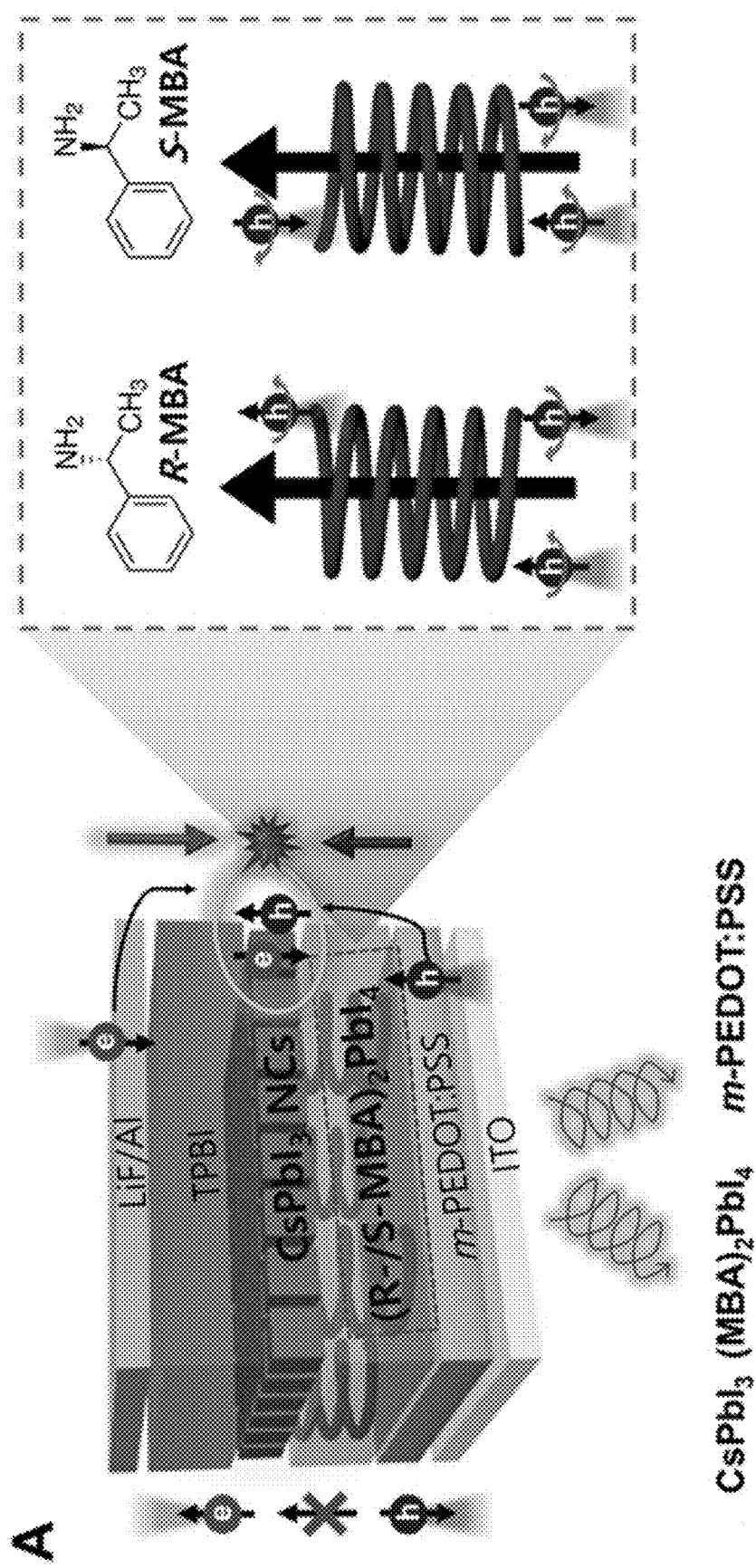
FIGS. 1A-1C provide structure and EL characterization of spin-LEDs.

100 Light Emitting Diode
110 Perovskite Conductive Layer
120 Perovskite Nanocrystal Emitting Layer
130 Anode Layer
140 Cathode Layer
150 Additive Layer
160 Substrate

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The term "stereochemically-selected" refers to a group of molecules that are specifically prepared to have the same chirality, e.g., a non-racemic selection of molecules. For example, a stereochemically-selected cation may comprise cations having at least 75%, 80%, 85%, 90%, 95%, 99%, or optionally 99.9% of the same chirality or enantiomer.

The term "solution processed" refers to high efficiency, low cost generation of perovskite materials using methods known in the art. Solution processing may occur at low temperatures, for example, less than 200° C., less than 150° C., less than 100° C., or optionally, at room temperature (e.g., approximately 25° C.). Solution processing may generate a variety (e.g., polycrystalline film, colloidal NC, single crystal, etc.) perovskite materials.

Figure 20:
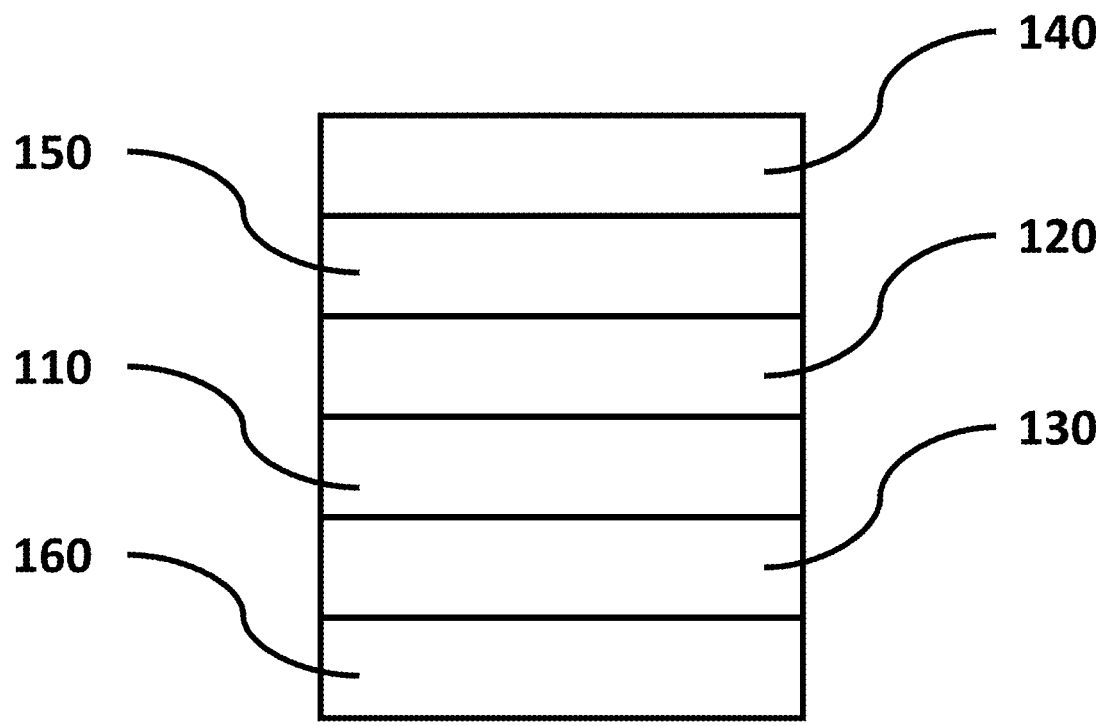
FIG. 20 provides an exemplary schematic of an LED device as described herein.

FIG. 20 provides an exemplary schematic of a light emitting diode (LED) 100, as described herein. The perovskite conductive layer 110 comprises stereochemically-selected cations, for example, non-racemic methylbenzylammonium, which influence electron spin, allowing for enablement of a spin-polarized light emitting diode capable of generating a circularly-polarized electroluminescence. A perovskite nanocrystal emitting layer 120 may be included in electronic communication with the perovskite conductive layer 110, and may comprise CsPbI nanocrystals, CsPbBr nanocrystals or a combination thereof. The LED 100 may further comprise an anode layer 130, for example, ITO and/or rn-PEDOT:PSS, which may further comprise sublayers. The LED may further comprise a cathode layer 140, for example, LiF, Al or a combination thereof. The LED 100 may also include an additive layer 150, for example, TBPI which may increase the efficiency of the LED device. Finally, the LED 100 may be deposited on a substrate 160, such as glass.

The provided discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

Example 1—Chiral Induced Spin Selectivity Enabling a Room Temperature Spin-LED

In traditional opto-electronic approaches, control over spin, charge, and light requires the use of both electrical and magnetic fields. In a spin-polarized light-emitting diode (spin-LED), charges are injected and circularly polarized light is emitted from spin-polarized carrier pairs. Typically, injection of carriers occurs with the application of an electric field, while spin-polarization can be achieved using an applied magnetic field or polarized ferromagnetic contacts. Described herein are chiral induced spin selectivity (CISS) producing spin-polarized carriers and a spin-LED that operates at room temperature without magnetic fields or ferromagnetic contacts. The CISS layer consists of oriented self-assembled small chiral molecules within a layered organic/inorganic metal-halide hybrid semiconductor framework. The spin-LED achieves ±2.6% circularly-polarized electroluminescence at room temperature. Thus, here we control spin, charge, and light with only an applied electric field.

SUMMARY

Typical modern opto-electronic technologies rely upon the ability to manipulate charge and light using semiconductors with the application of an electric field, with the spin of the electrons not exploited. The use of ferromagnetic contacts allows for control of spin populations in the semiconductor with the help of an applied magnetic field; thus, such devices generally include both semiconductors and ferromagnets. In contrast to those approaches, described herein is the control of charge, spin, and light through the use of chiral induced spin selectivity (CISS). When current passes through the CISS layer, the spin of the transmitting carriers becomes polarized through an effective spin-orbit interaction. Therefore, the chiral layer acts as a spin-filter producing a spin-polarized current upon the application of an applied electric field. Described is a room-temperature spin-polarized light emitting diode (spin-LED). Spin-LEDs control the orientation and intensity of circularly polarized electroluminescence (CP-EL) depending on the spin polarization of injected holes or electrons. Our spin-LED emits CP-EL with 2.6% efficiency at room-temperature, without applying a magnetic field or using a ferromagnetic contact. Spin-LEDs are intriguing devices in their own right for various technologies including quantum-based optical computing and information processing, 3D displays, bioencoding, and tomography. However, the provided demonstration illustrates that the CISS effect can be employed in order to control spin, light and charge has much broader implication for a larger class of opto-spintronic applications.

Metal-halide perovskite (MHP) semiconductors and their related family of organic/inorganic hybrid semiconductors have a number of interesting properties for controlling spins, light and charges: They have large spin-orbit coupling yet also exhibit long spin lifetimes, controllable Rashba splitting through the degree and nature of the metal-halide octahedral distortion and exhibit excellent electrical properties, such as, balanced long charge carrier diffusion lengths and low effective trap densities. MHP nanocrystals (NCs) feature outstanding optical properties including narrow spectral emission (full width at half maximum (FWHM)<35 nm), ultrahigh color purity, high photoluminescence (PL) quantum efficiency (>70%), and wide color tunability (400 nm<λ<800 nm), which fulfill the majority of the requirements for the use of circularly polarized light in advanced technologies. They are solution-processable at low temperature (<150° C.) and can be fabricated in various crystal forms (e.g., polycrystalline films, colloidal NCs, single crystals), which offer a wide selection of device architectures, processing conditions, etc. Recently, spin-LEDs fabricated using methylammonium lead bromide ($MAPbBr_3$) polycrystalline films demonstrated CP-EL by injecting spin-polarized holes through a ferromagnetic electrode ($La_{0.63}Sr_{0.37}MnO_3$) resulting in the emission of CP-EL. However, those devices required extremely low temperatures (10 K) and external magnetic fields (>150 mT) to exhibit CP-EL; but they clearly demonstrate long spin-diffusion lengths in 3D MHP semiconductors.

Described herein are spin-LEDs based on a solution-processed MHP heterostructure in which spin-polarized holes from the CISS (chiral 2D layered perovskite) layer are injected into an adjacent layer of perovskite NC emitters (FIG. 1A). 2D layered hybrid perovskites can incorporate chiral organic molecules into their crystal framework. The chiral organic molecules induce a chiral-optical response in the inorganic sublattice forming an intriguing class of hybrid chiral semiconductors that control the transport of spin-polarized charge carriers at room temperature. The spin-polarized hole injection layer is composed of a 30-60 nm thick chiral 2D layered R-/S-methylbenzylammonium lead iodide (($R-/S-MBA)_2PbI_4$) polycrystalline bulk film that results in a spin-polarized hole current with up to 81% selectively, with the spin-orientation determined by the handedness of the MBA cation. In our experiment, the injected spin-polarized holes radiatively recombine with properly aligned injected electrons in the colloidal perovskite NC layer to exhibit CP-EL.

Circularly polarized emission results from polarized spin carriers through optical selection rules as follows. At the bandedges the electronic structure in the Pb-halide perovskite family of semiconductors forms a simple two-level structure. The valence band is a mixture of Pb 6s and halide 4p atomic orbitals with an overall s symmetry and the conduction band arises from the 6p orbitals of Pb hybridized with the halide frontier s orbitals with overall p-symmetry. Due to large spin-orbit coupling, the total angular momentum is conserved to yield a doubly degenerate $J_e=½$ for the electrons in the conduction band and a doubly degenerate $J_h=½$ for holes in the valence band. Light emission is governed by optical selection rules described by the angular momentum quantum number J and the magnetic quantum number $m_j=±½$ with allowed transitions occurring for $\Delta J=0$ and $\Delta m_j=±1$. Emission of circularly polarized light ($\sigma^+$ or $\sigma^-$) results when the population of carriers is spin-polarized (i.e., the population of $m_j=½$ is greater than $m_j=-½$, or vice versa). In contrast, unpolarized light emission is formed when there are equal populations of the degenerate $m_j$ levels. The CP-EL efficiency is governed by the degree of polarization in the $m_j$ levels (spin-injection efficiency) after spin-scattering of the initially polarized carriers. We find that alloying the $CsPbI_3$ with Br improves the CP-EL efficiency by suppressing spin-scattering of spin-polarized carriers, which we study using circularly polarized picosecond (ps) transient absorption (TA).

Described are exemplary spin-LEDs based on the following structure (FIG. 1A) [glass/indium tin oxide (ITO)/modified poly(3,4-ethylenedioxythiophene) polystyrenesulfonate (m-PEDOT:PSS) (~100 nm)/(R-/S-/rac-MBA)$_2$PbI$_4$ polycrystalline films (~30 nm)/CsPbI$_3$ NCs (~20 nm)/2,2',2-(1,3,5-benzinetriyl)-tris(1-phenyl-1-H-benzimidazole) (TPBI) (50 nm)/lithium fluoride (LiF) (1 nm)/Al (100 nm)]. The m-PEDOT:PSS consists of PEDOT:PSS and perfluorinated polymeric ionomer (PFI); PFI has lower surface energy (20 mN/m$^2$) than does PEDOT:PSS (38 mN/m$^2$) and thus self-organizes during spin-coating, with a gradually increasing PFI concentration from the bottom surface to the top surface. This self-organized PEDOT:PSS/PFI layer induces a gradual increase in the ionization energy from the bottom (5.20 eV) to the top (5.95 eV) because PFI has deeper ionization energy (6.10 eV) (energy diagram will be shown in FIG. 3A) and enables efficient hole-injection into the CISS layer. The chiral 2D metal-halide CISS layer is spin-coated on top of the m-PEDOT:PSS layer. Spin-coating the (R-/S-/rac-MBA)$_2$PbI$_4$ CISS layer on the m-PEDOT:PSS layer produces polycrystalline films that have preferential orientation such that the 2D metal-halide layers are parallel to the substrate, whereas the chiral organic molecules and the inorganic PbI$_6$ motifs are perpendicular and form an horizontally oriented organic/inorganic multiple-quantum-well (MQW)-like structure; this was confirmed by X-ray diffraction (XRD) data showing only (0 0 2l) peaks (FIG. 5) on top of an amorphous response from the underlying m-PEDOT:PSS layer. The chiral molecule's helical axis is perpendicular to the NC light emitting layer and parallel to the charge conduction direction. The m-PEDOT:PSS layer blocks electrons and passes holes to the chiral layer, whereas the TPBI layer blocks holes and passes electrons, so that the injected electron/hole pairs are confined within the NC emitter layer.

Figure 1B:
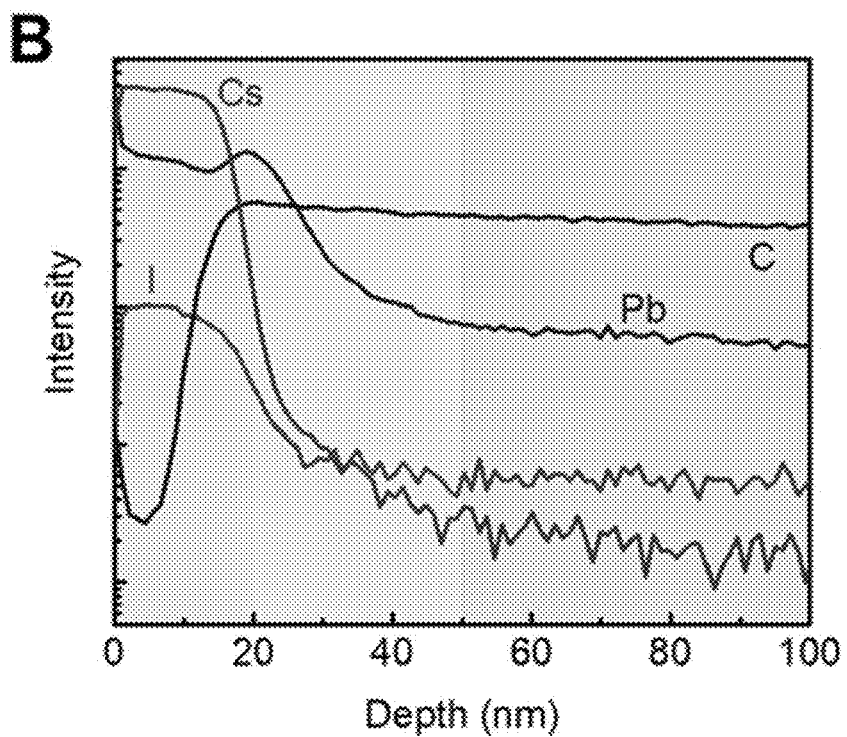
Figure 6A:
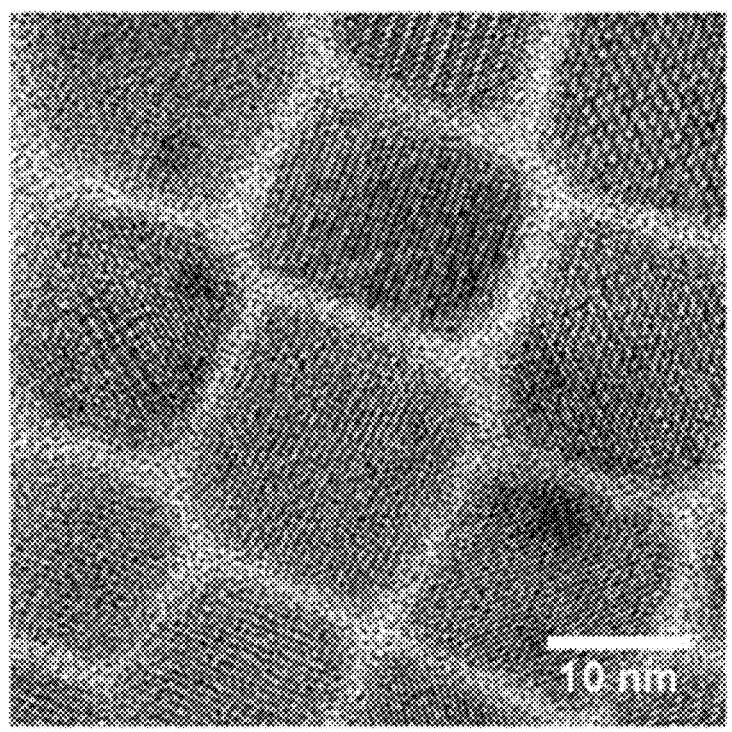
FIGS. 6A-6B provide a TEM image (FIG. 6A) and PL spectrum (FIG. 6B) of colloidal CsPbI$_3$ NCs.
Figure 6B:
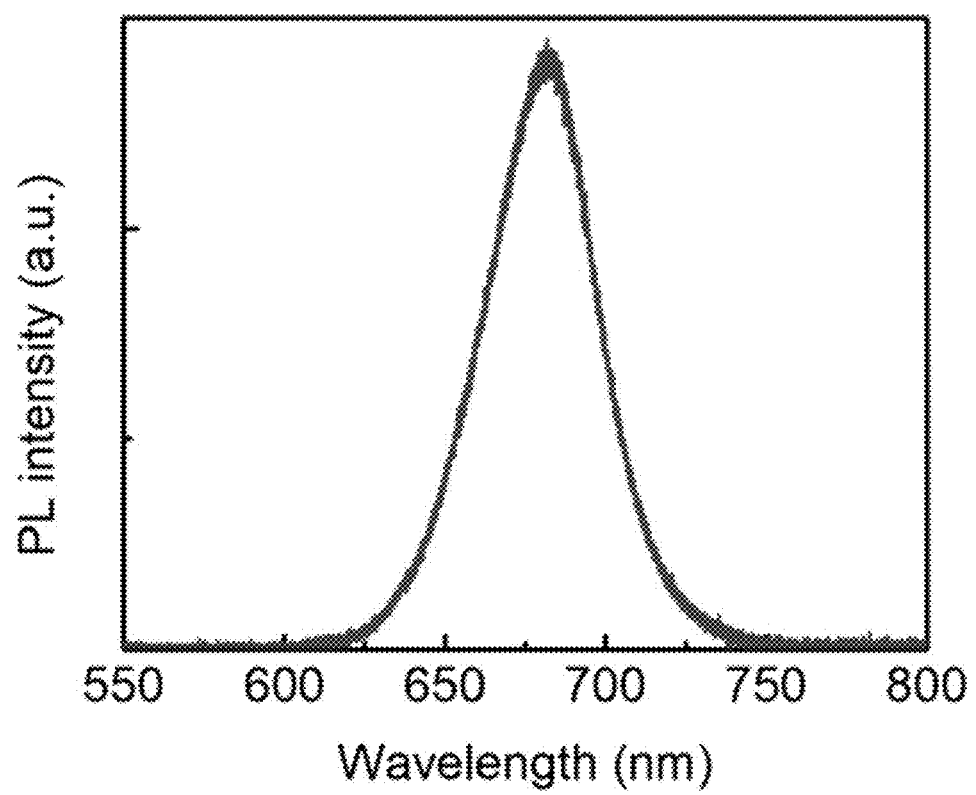
Figure 7A:
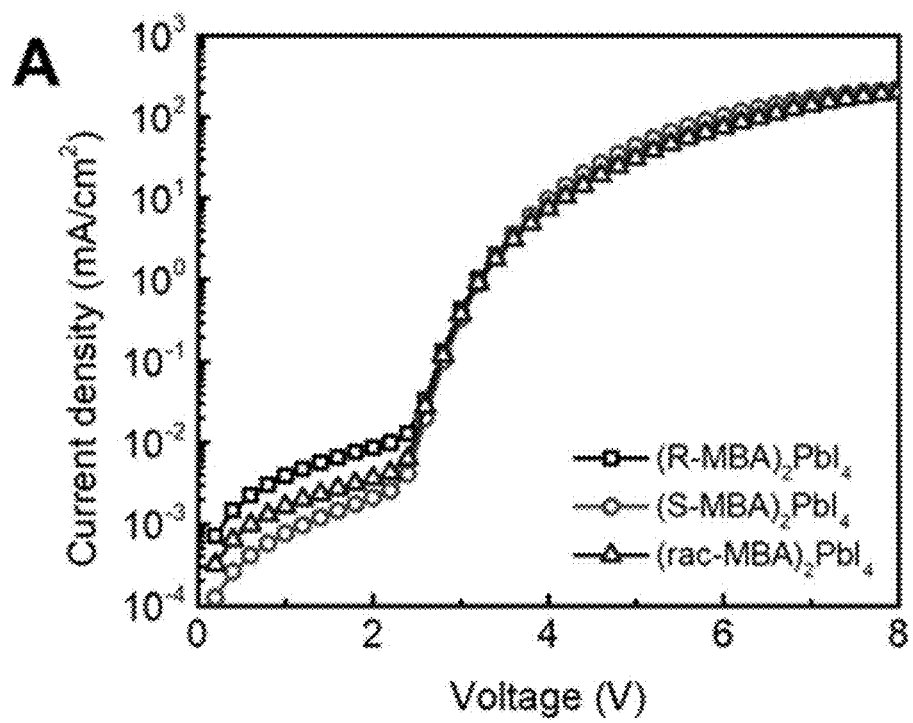
FIGS. 7A-7D provide (FIG. 7A) Current density-versus-voltage characteristics, (FIG. 7B) luminance-versus-voltage characteristics, and (FIG. 7C) external quantum efficiency-versus-voltage characteristics of spin-LEDs based on (R-/S-/rac-MBA)$_2$PbI$_4$ PC films.
Figure 7B:
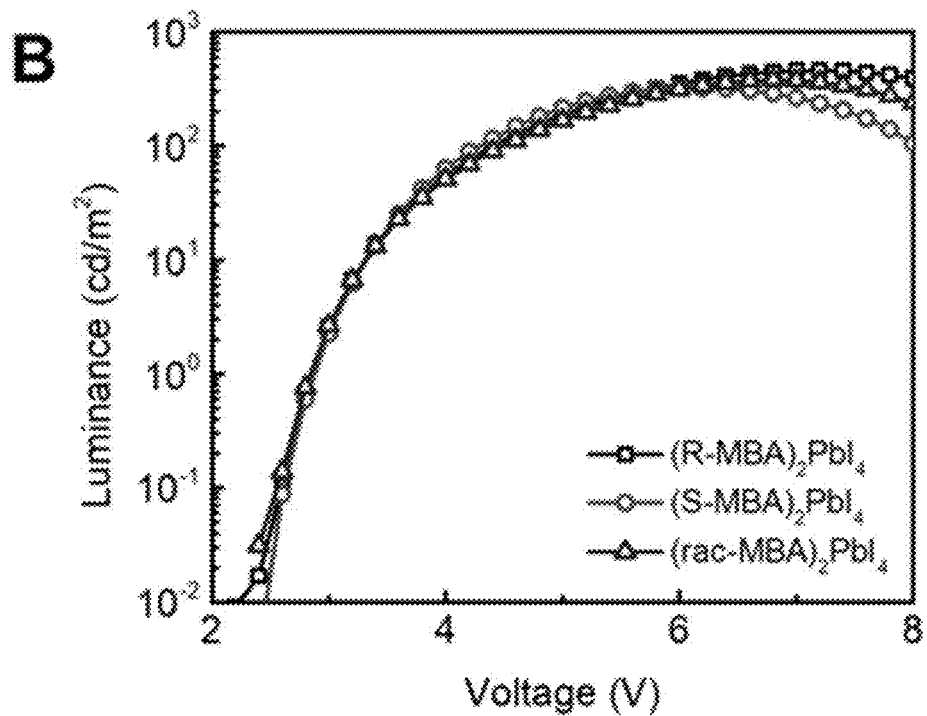
Figure 7C:
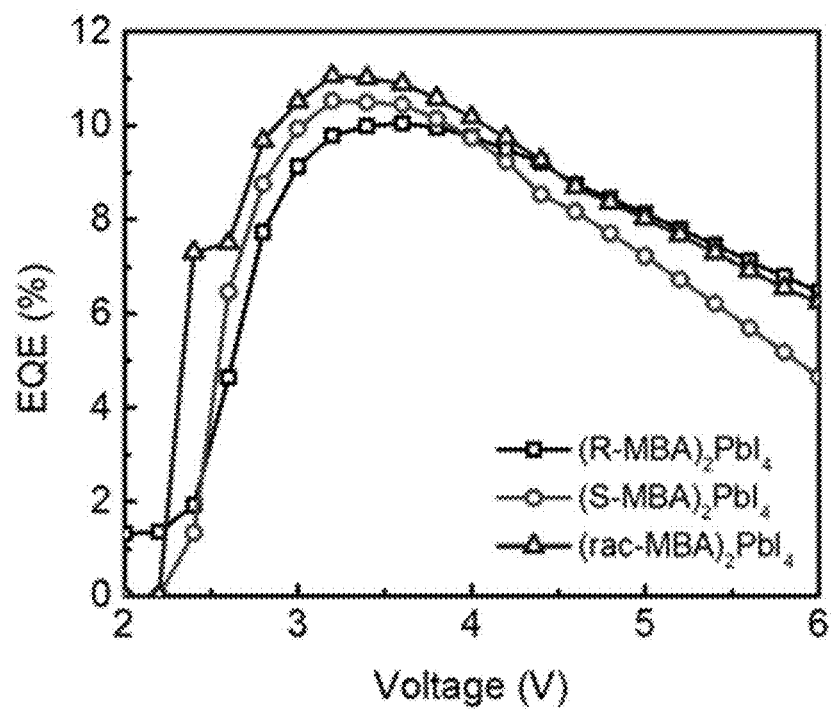
Figure 7D:
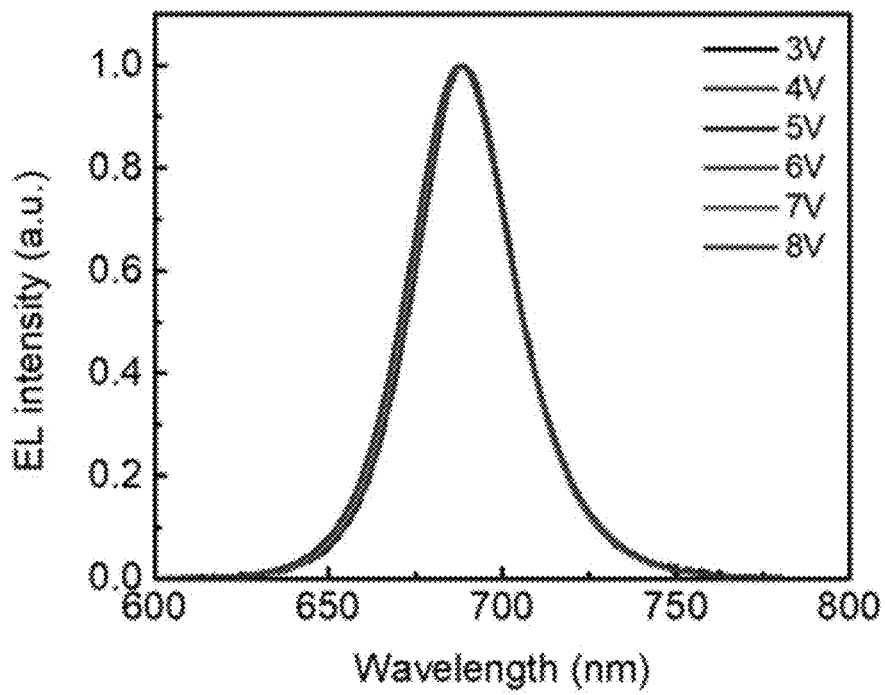

Here we employ colloidal CsPbX$_3$ (X=I, Br) NCs because ligand mediated solvation enables processing from octane which does not redissolve the underlying (R-/S-/rac-MBA)$_2$PbI$_4$ polycrystalline films. Consequently, a metal-halide heterostructure is formed by spin-coating colloidal CsPbI$_3$ NCs (size ~10-15 nm) (FIG. 6) on top of the CISS layer. The formation of a well-defined CISS layer/CsPbI$_3$ NC heterostructure is confirmed by time-of-flight secondary ion mass spectroscopy (ToF-SIMs) depth profiling (FIG. 1B). The signal from Cs drops sharply at the interface (FIG.

1B, purple-trace) while both I and Pb also drop, but to a lesser extent, because their density in the 2D CISS layer is much lower than that in the NC layer. To limit the transport and spin dephasing losses in the NC layer, we limit its thickness to ~20-30 nm, or effectively ~1-2 NCs thick.

Figure 2A:
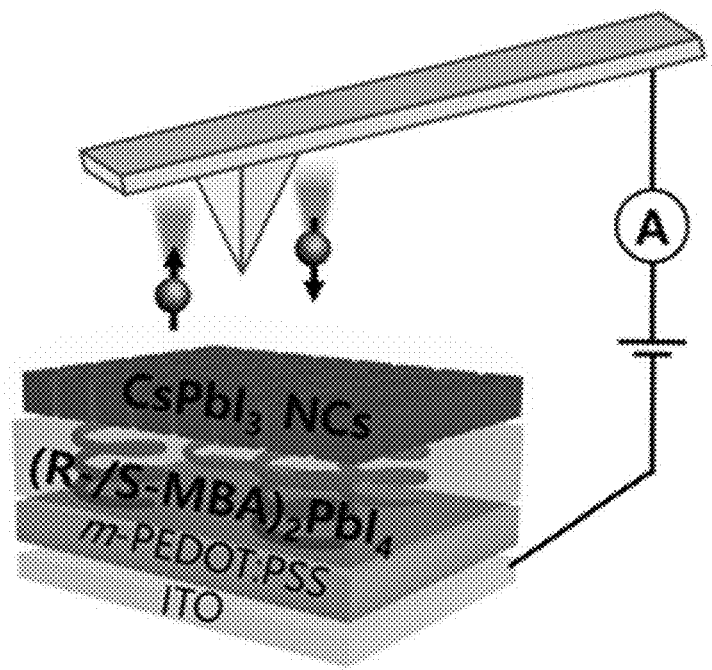
FIGS. 2A-2F provide Spin-polarized charge injection and CP-EL characteristics in spin-LEDs.
Figure 2B:
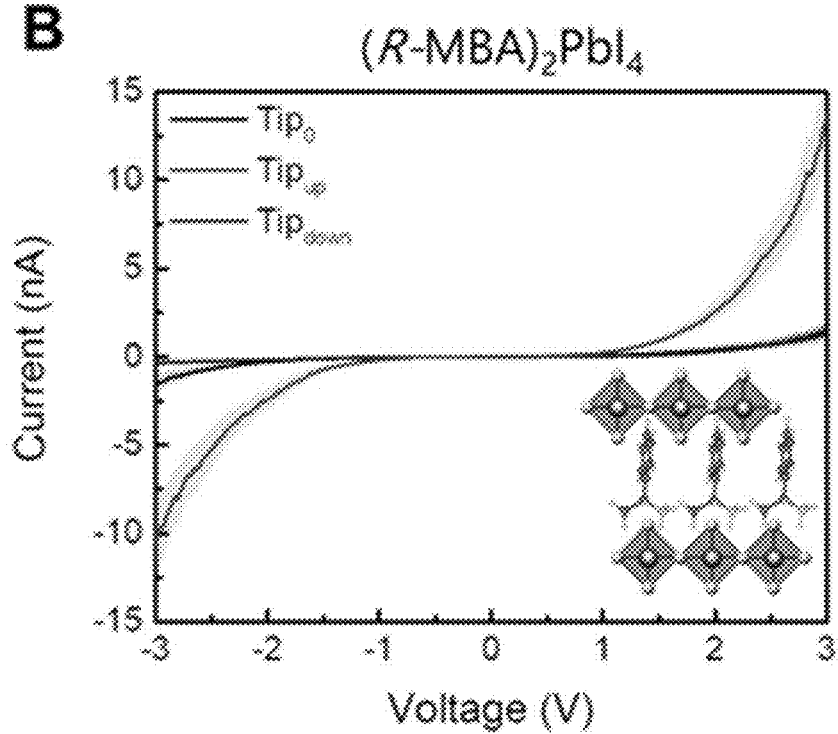
Figure 2C:
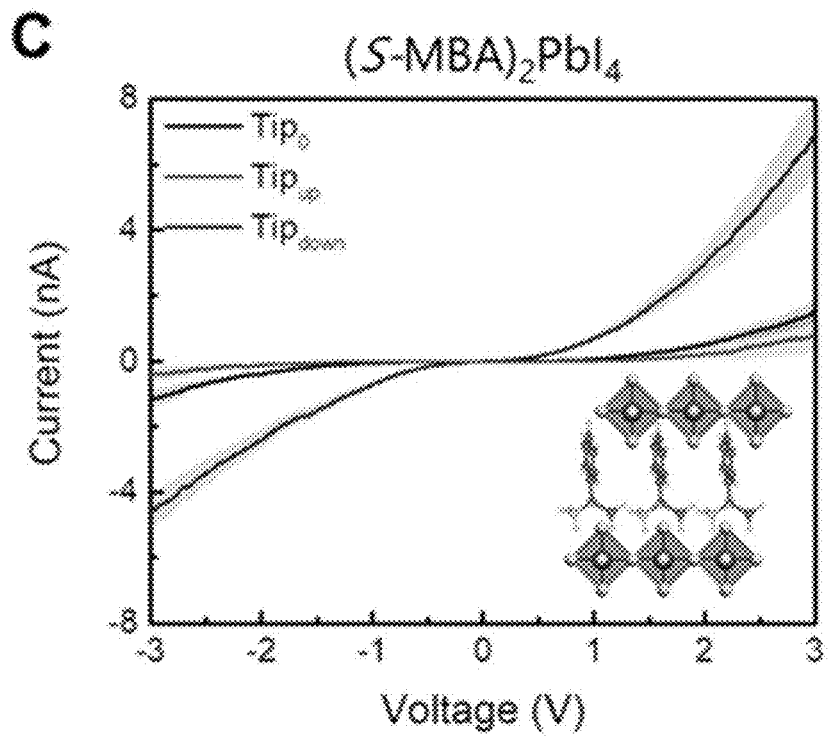

Prior to the discussion of the spin-LED properties and to directly study the spin-polarized charge transport properties of the CISS layer, we conducted magnetic conductive-probe atomic force microscopy (mCP-AFM) measurements. FIG. 2A-2C shows the results with NCs on top of the CISS layer, whereas results without the NC layer are shown in FIG. 7. Ferromagnetic Co—Cr coated tips were pre-magnetized by an external magnet with opposite magnetization directions (up or down relative to the substrate plane) immediately before measurement to selectively measure the current of spin-polarized charge carriers (with up- or down-polarized spin). Following charge carrier injection from the ITO/m-PEDOT:PSS electrode, the carriers drift perpendicularly through the horizontally oriented organic/inorganic MQW-like chiral structures (FIG. 5) and subsequently they are injected into the NC layer before penetrating into the magnetized AFM tip. The current-voltage (I-V) responses show that polarized carriers are transmitted through the CISS and NC layers with high selectivity, whereas there is no spin preference for the racemic layer.

From the I-V responses, we conclude that the current through the ITO/m-PEDOT:PSS/(R-/S-MBA)$_2$PbI$_4$/CsPbI$_3$ NC structure drifts depending on the chirality of the MBA cation and the magnetization direction of the Co—Cr coated tips. ITO/m-PEDOT:PSS/(R-MBA)$_2$PbI$_4$/CsPbI$_3$ NC film shows much higher current when the tip is magnetized up (13.64 nA at 3 V which is the operational bias of spin-LEDs) than when the tip is magnetized down (1.40 nA at 3 V) or non-magnetized (1.53 nA at 3V) (FIG. 2B). In contrast the current in the ITO/m-PEDOT:PSS/(S-MBA)$_2$PbI$_4$/CsPbI$_3$ NC film is higher when the tip is magnetized down (6.88 nA at 3 V) compared to when the tip is magnetized up (0.75 nA at 3 V) or non-magnetized (1.49 nA at 3V) (FIG. 2C). Using the measured currents, we calculate the selectivity of polarized spin current, $P_{spin}$, of CISS layers following the relation, $$P_{spin} = \frac{I_{up} - I_{down}}{I_{up} + I_{down}} \times 100\%, \quad [1]$$

where $I_{up}$ and $I_{down}$ are the electrical currents measured with the Co—Cr coated tips which are pre-magnetized in the up- and down-direction, respectively. Using Eq. (1), we calculate $P_{spin}$ in the ITO/m-PEDOT:PSS/(R-MBA)$_2$PbI$_4$/CsPbI$_3$ NC films and ITO/m-PEDOT:PSS/(S-MBA)$_2$PbI$_4$/CsPbI$_3$ NC films to be +81% and −80%, respectively, at a bias of 3V. The ITO/m-PEDOT:PSS/CISS films (without NC layer) also exhibit anisotropic current flow depending on the chirality of the MBA cation and the magnetization direction of the Co—Cr coated tips (FIG. 7). The injection barrier decreases without the NC-layer such that a lower applied voltage is required to observe the same current polarization. In that case, the ~80% spin-polarized currents are observed at ~1V applied bias; but it is likely that the field dropped across the CISS layer is similar for the two measurements. However, the degree of polarization is very similar, suggesting that the spin-polarized injection from the CISS layer into the NC layer is high and the spin-diffusion length in the NC layer is at least 1-2 NCs. The measured spin-polarized charge current occurs at room temperature and in principle does not require a ferromagnetic device component (e.g., contact) or another external magnetic field, unlike conventional magnetic semiconductors (e.g., (Ga, Mn)As, BeZnMnSe) or ferromagnetic metals (e.g., Ni, Co).

As described, a ferromagnetic contact is employed in order to detect the spin-polarized current. Other groups have suggested that such CISS demonstrations can only be measured in a non-linear regime when using a ferromagnetic contact in a two terminal device due to an Onsager reciprocity relationship, since the CISS effect does not break time-reversal symmetry. A possible mechanism of breaking the Onsager reciprocity is through energy relaxation upon tunneling through the organic molecular orbitals of the chiral molecules. As described herein, we employ circularly polarized emission to detect the spin-current and do not use a ferromagnetic contact, thus avoiding this complication.

Figure 1C:
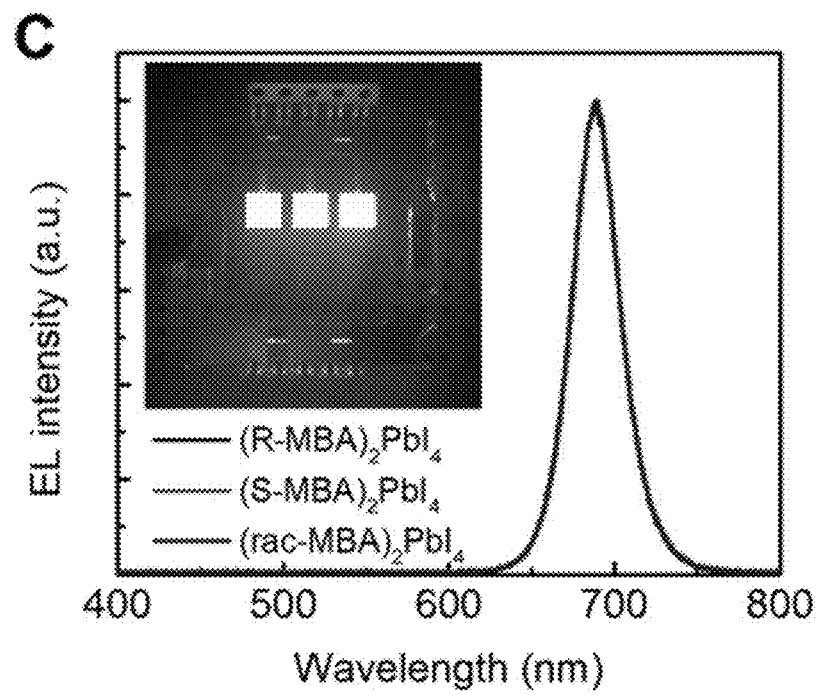
Figure 8A:
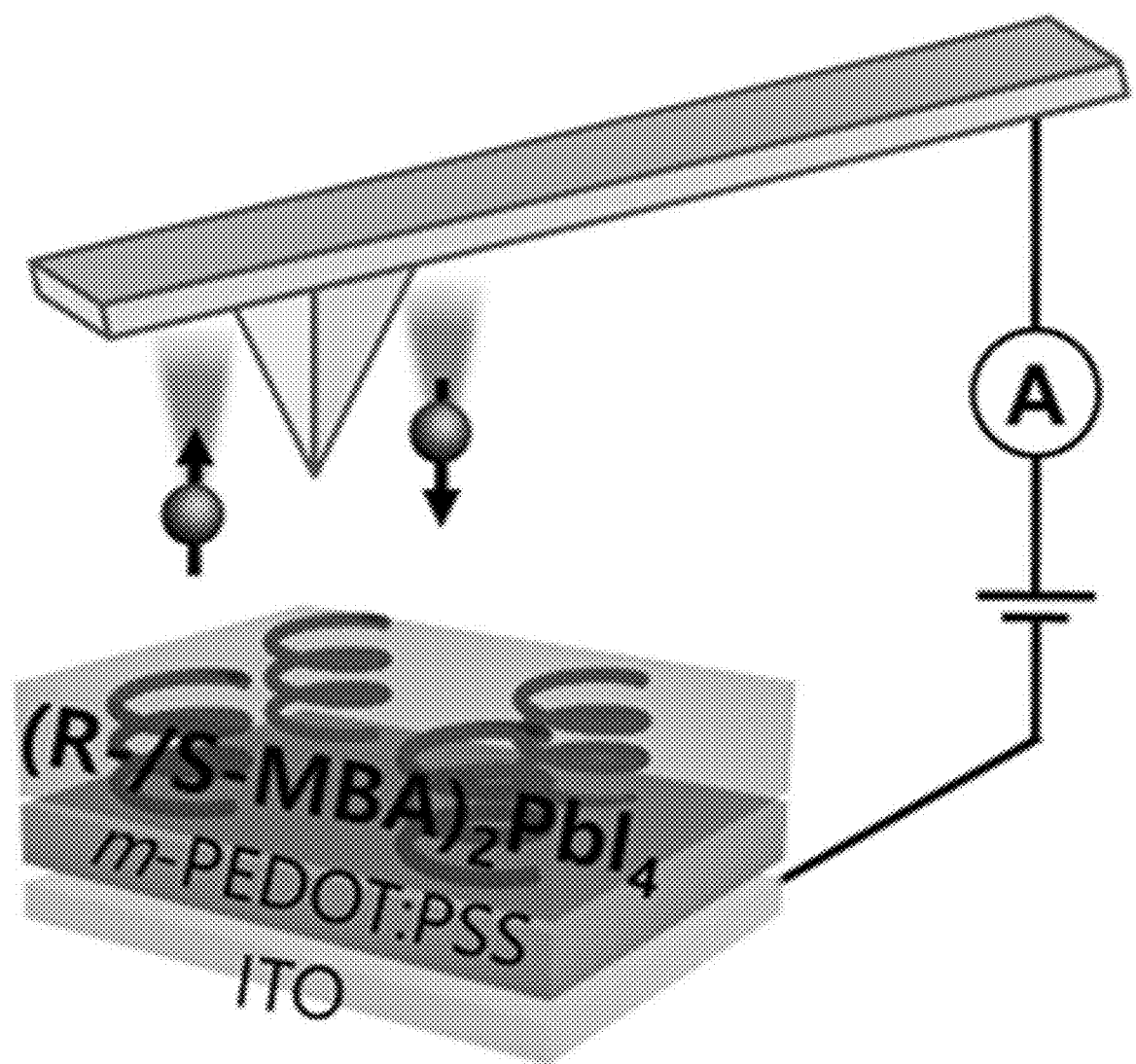
FIGS. 8A-8C provide (FIG. 8A) Schematic illustration of (mCP-AFM) measurements of m-PEDOT:PSS/(R-/S-MBA)$_2$PbI$_4$ films. Current-voltage curves of (FIG. 8B) m-PEDOT:PSS/(R-MBA)$_2$PbI$_4$ films and (FIG. 8C) m-PEDOT:PSS/(S-MBA)$_2$PbI$_4$ films measured by mCP-AFM at room temperature.
Figure 8B:
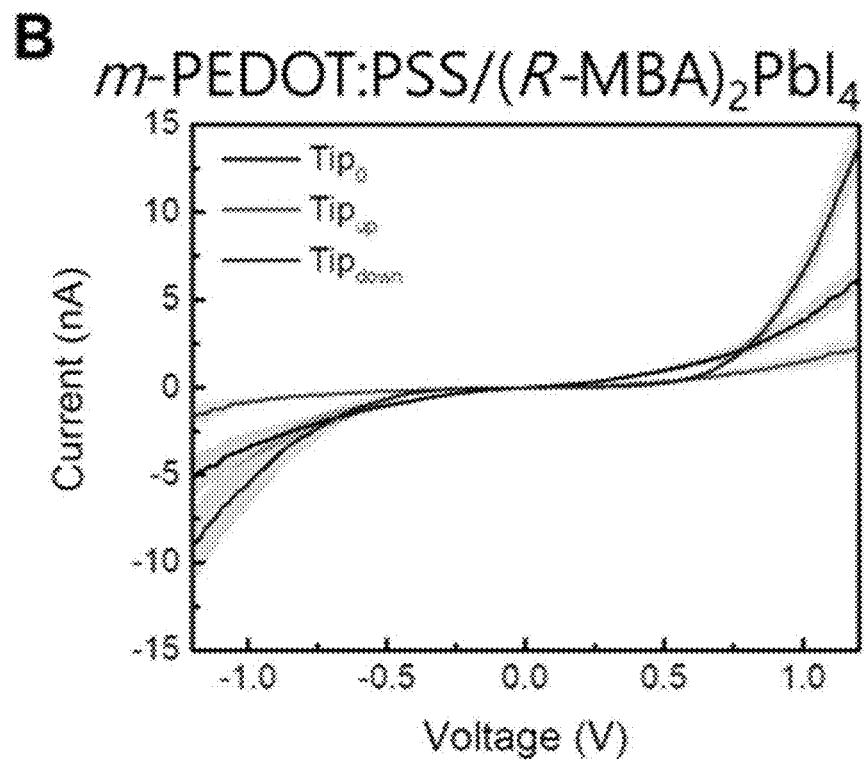
Figure 8C:
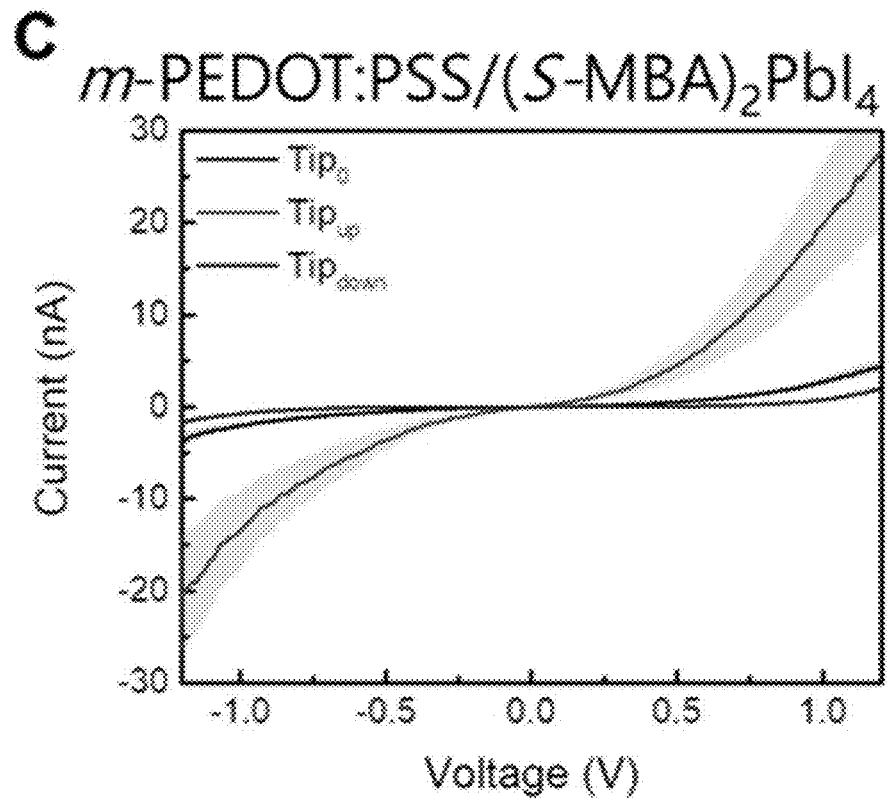

The provided measurements indicate that MHPs overcome the disadvantages of previous spin-injecting materials and are an attractive system for spin-injection contacts for opto-spintronic applications. Spin-LEDs based on CISS/CsPbI$_3$ NC heterostructure show turn-on voltage of 2.4 V and high external quantum efficiencies (EQEs) (10.05%, 10.53% and 11.05% for spin-LEDs based on (R-MBA)$_2$PbI$_4$, (S-MBA)$_2$PbI$_4$ and (rac-MBA)$_2$PbI$_4$, respectively) (FIGS. 8A-8C). These are the highest EQEs among reported MHP LEDs based on pure CsPbI$_3$ NCs without any post treatment (Table 1). Our spin-LEDs show bright red emission with sharp EL spectra (EL centered at 688 nm, FWHM ~32 nm) which does not change with the applied bias up to 8 V (after which breakdown occurs), confirming that both the CISS layer and TPBI electron transport layer efficiently confine the charge carriers in the CsPbI$_3$ NC emitting layers (FIG. 1C, FIG. 8).

TABLE 1

| | EL efficiencies of our devices and previously reported CsPbI$_3$ NCs based PeLEDs. | | |
|---|---|---|---|
| Publication date | EL wavelength, strategy | Device structure | EL efficiencies (external quantum efficiency) |
| Our work | 688 nm, without any treatment | ITO/PEDOT:PSS[a]:PFI[b]/ (R-/S-/rac-MBA[c])$_2$PbI$_4$/ CsPbI$_3$ NCs/TPBI[d]/LiF/Al | 11.05% (untreated) |
| 2016/05 | 698 nm, trimethylaluminum treatment | ITO/ZnO/CsPbI$_3$ NCs/TFB[e]/MoO$_3$/Au | ~0.22% (untreated) 5.7% (treated) |
| 2016/10 | ~690 nm, without any treatment | ITO/ZnO/PEI[f]/CsPbI$_3$ NCs/CBP[g]/TCTA[h]/MoO$_3$/Au | 7.25% (untreated) |
| 2017/10 | 693 nm, without any treatment | ITO/PEDOT:PSS/CsPbI$_3$ NCs/TPBI/LiF/Al | 0.21% (untreated) |
| 2017/12 | 688 nm, 2,2'-iminodibenzoic acid ligand treatment | ITO/PEDOT:PSS/poly-TPD[i]/ CsPbI$_3$ NCs/TPBI/LiF/Al | 2.26% (untreated) 5.02% (treated) |

TABLE 1-continued

EL efficiencies of our devices and previously reported CsPbI$_3$ NCs based PeLEDs.

| Publication date | EL wavelength, strategy | Device structure | EL efficiencies (external quantum efficiency) | |
|---|---|---|---|---|
| 2018/06 | 690 nm, Ag doping | ITO or Ag/ZnO/PEI/CsPbI$_3$ NCs/CBP/TCTA/MoO$_3$/Au or Au/MoO$_3$ | 7.3% | (untreated) |
| | | | 11.2% | (treated) |
| 2018/08 | ~690 nm, PEA ligand treatment PEA & PEAI treatment | ITO/PEDOT:PSS/poly-TPD$^i$/ CsPbI$_3$ NCs/TPBI/LiF/Al | 2.45% | (untreated) |
| | | | 7.36% | (PEA treated) |
| | | | 14.08% | (PEA & PEAI treated) |
| 2018/09 | ~691 nm, PbS treatment | ITO/ZnO/PEI/CsPbI$_3$ NCs/TCTA/MoO$_3$/Au | 6.9% | (untreated) |
| | | | 11.8% | (treated) |
| 2018/10 | 691 nm, Sr doping & Cl surface passivation | ITO/ZnO/PEI/CsPbI$_3$ NCs/TCTA/MoO$_3$/Au | ~7.5% | (untreated) |
| | | | 13.5% | (treated) |
| 2019/01 | 678 nm, Sr doping | ITO/PEDOT:PSS/poly-TPD/ CsPbI$_3$ NCs/TPBI/LiF/Al | ~2.5% | (untreated) |
| | | | 5.92% | (treated) |
| 2019/02 | ~690 nm, Zn alloy | ITO/ZnO/PEI/CsPbI$_3$ NCs/TCTA/MoO$_3$/Au | ~6% | (untreated) |
| | | | 15.1% | (treated) |
| 2020/03 | 686 nm, Zr doping | Si/Ag/ZnO/PEI/CsPbI$_3$ NCs/TCTA/MoO$_3$/Au | 10.5% | (untreated) |
| | | | 13.7% | (treated) |
| 2020/08 | 682 nm, octylphosphonic acid ligand treatment | ITO/ZnO/PEI/CsPbI$_3$ NCs/TCTA/MoO$_3$/Au | 9.7% | (untreated) |
| | | | 12.6% | (treated) |
| 2020/09 | 620 nm, without any treatment | ITO/PEDOT:PSS/PVK$^j$/CsPbI$_3$ nanowires/ZnO/Ag | 6.2% | (untreated) |

$^a$PEDOT:PSS: Poly(3,4-ethylenedioxythiophene)-poly(styrenesulfonate);
$^b$PFI: Perfluorinated ionomer;
$^c$MBA; Methylbenzyl ammonium;
$^d$TPBI: 2,2',2"-(1,3,5-Benzinetriyl)-tris(1-phenyl-1-H-benzimidazole);
$^e$TFB: poly[(9,9-dioctylfluorenyl-2,7-diyl)-co-(4,4'-(N-(4-sec-butylphenyl))diphenylamine)];
$^f$PEI: polyethylenimine;
$^g$CBP: 4,4'-bis(Ncarbazolyl)-1,1'-biphenyl;
$^h$TCTA: 4,4',4"-Tri(N-carbazolyl)triphenylamine;
$^i$poly-TPD: Poly[bis(4-phenyl) (4-butylphenyl) amine];
$^j$PVK: poly(9-vinylcarbazole)

Figure 2D:
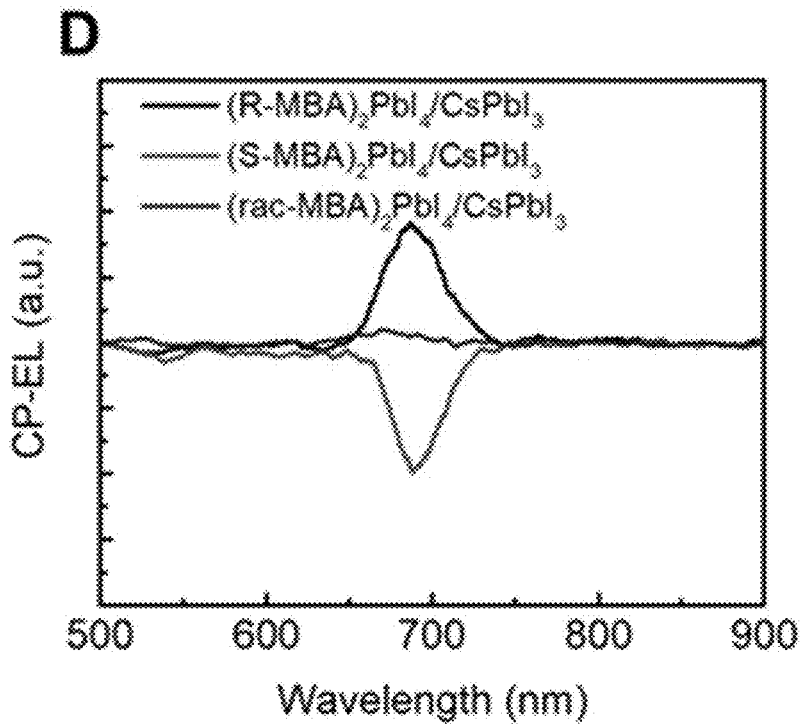
Figure 2E:
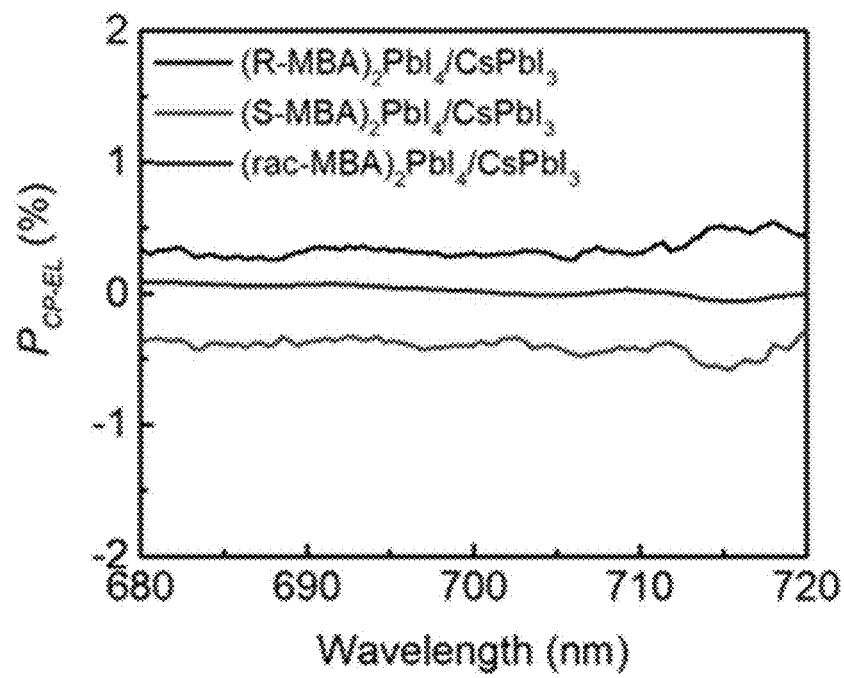
Figure 9:
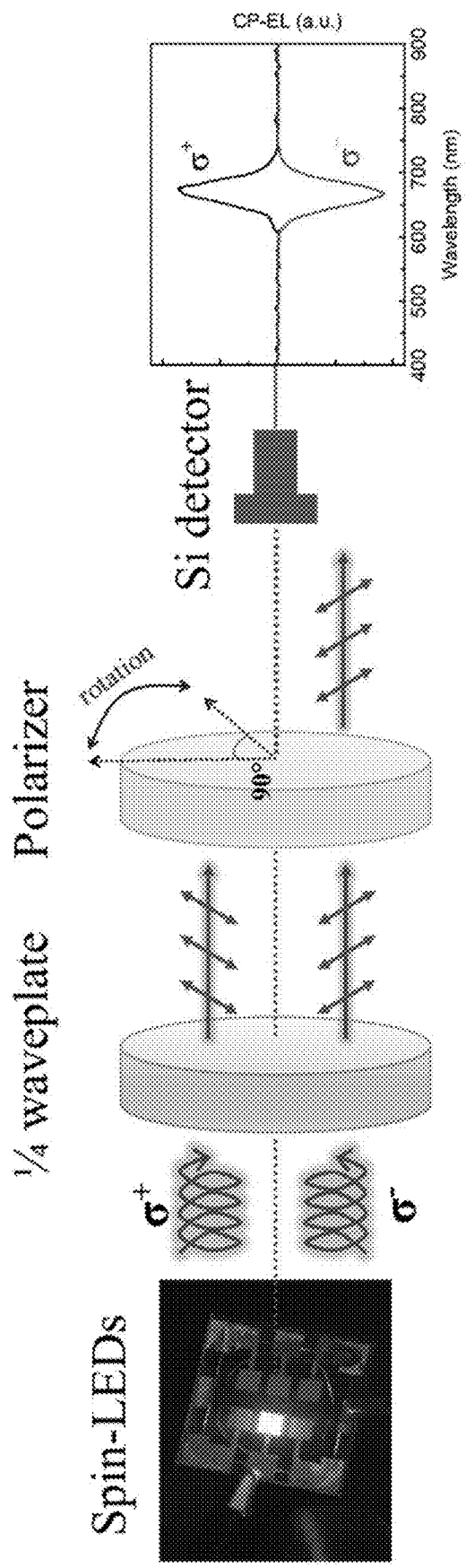
FIG. 9 provides a schematic illustration of CP-EL measurement system.
Figure 10A:
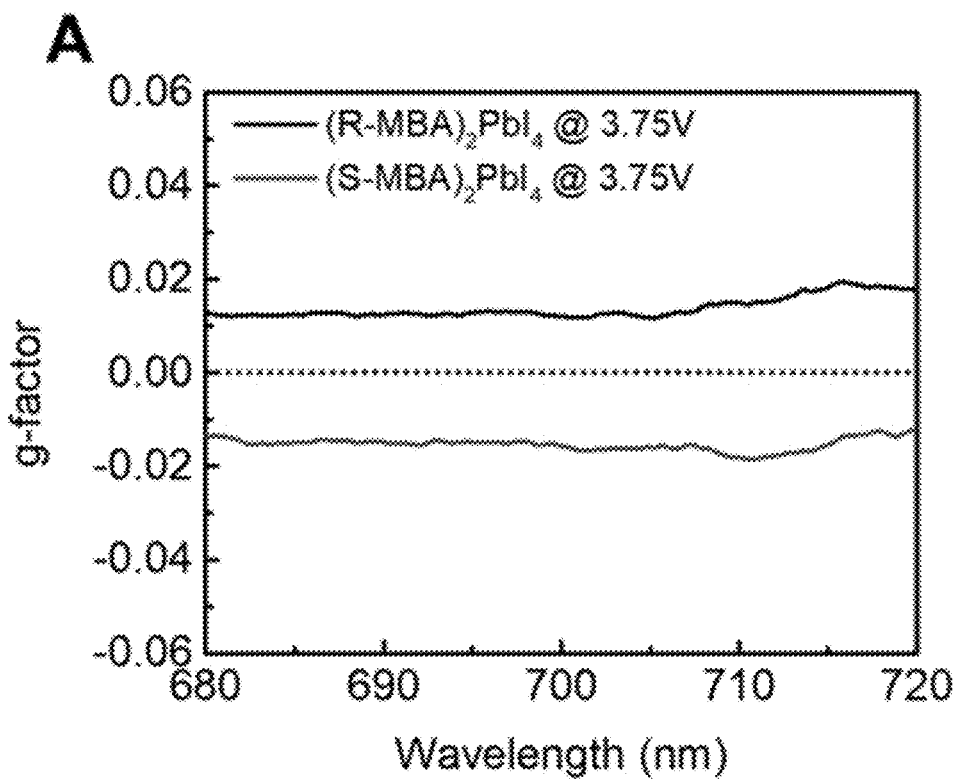
FIGS. 10A-10D provide P$_{CP-EL}$ of spin-LEDs based on CISS layer/CsPbI$_3$ NC heterostructure measured at (FIG. 10A) 3.75 V, (FIG. 10B) 4 V, (FIG. 10C) 4.25 V and (FIG. 10D) 4.5 V.
Figure 10B:
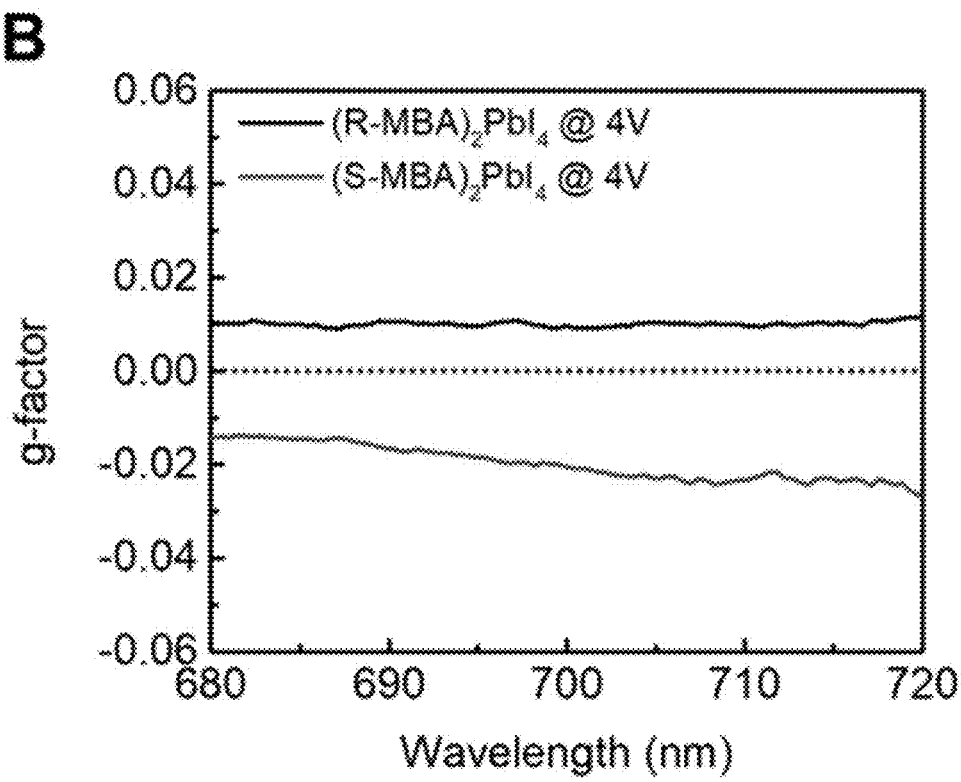
Figure 10C:
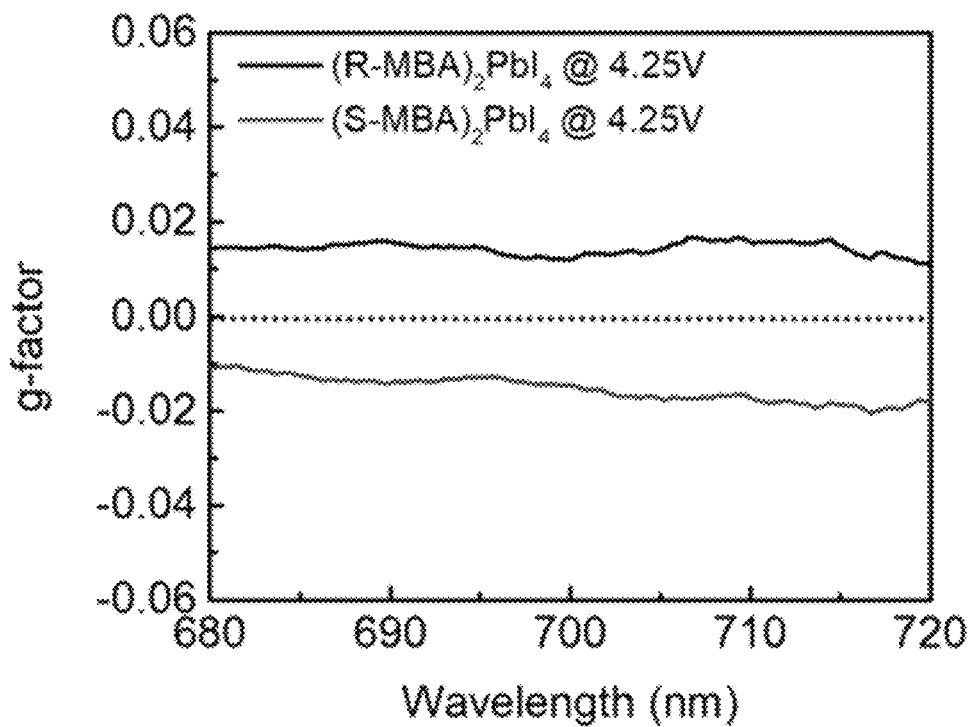
Figure 10D:
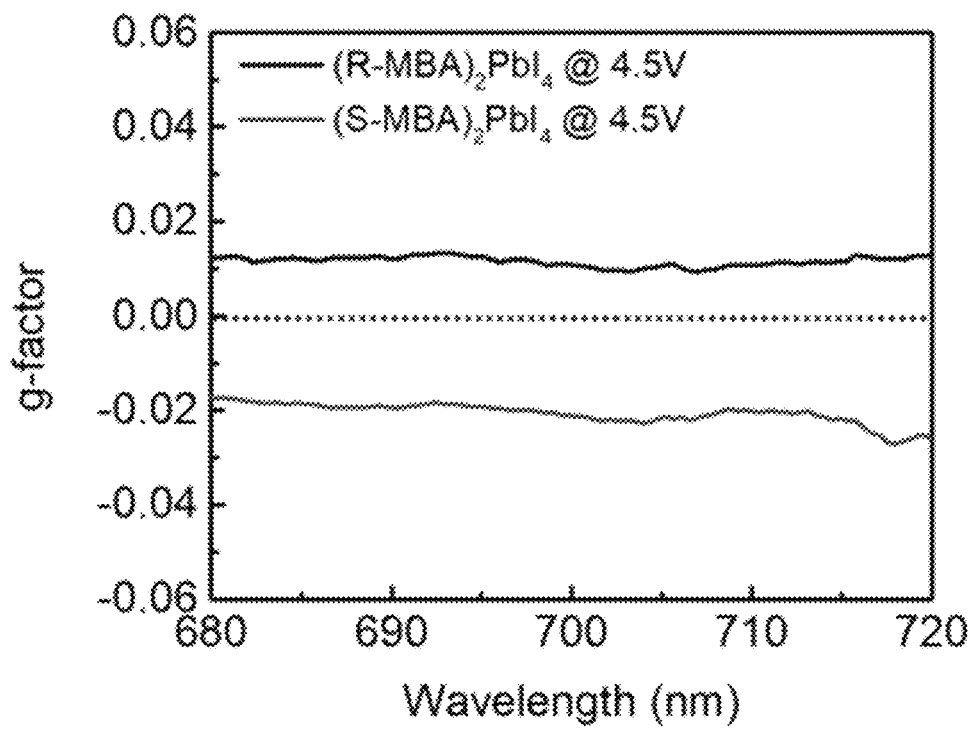

For the spin-LEDs, the CP-EL signal is measured by separating the emitted light into left- and right-circularly polarized components using a broadband quarter-wave plate followed by a linear polarizer and a spectrometer (FIG. 9). We calculate the polarization degree of the CP-EL, $P_{CP-EL}$, using the relation.

$$P_{CP-EL} = \frac{I_{left} - I_{right}}{I_{left} + I_{right}} \times 100\% \quad [2]$$

where $I_{left}$ and $I_{right}$ are the EL intensities of left- and right-circularly polarized light, respectively. Spin-LEDs based on CISS/CsPbI$_3$ NC heterostructure show clear CP-EL spectrum centered at 688 nm with average $P_{CP-EL}$=±0.25% at 680≤λ≤720 nm (FIGS. 2D-2E). These spin-LEDs show similar $P_{CP-EL}$ with different thicknesses of CISS layers (~30 nm and ~60 nm) (FIG. 10). In contrast, the (rac-MBA)$_2$PbI$_4$-based devices exhibit no CP-EL emission (FIGS. 2D-2E). The thickness independence is consistent with previous results illustrating that the spin-polarization saturates at a CISS layer thickness of ~30 nm.

Figure 2F:
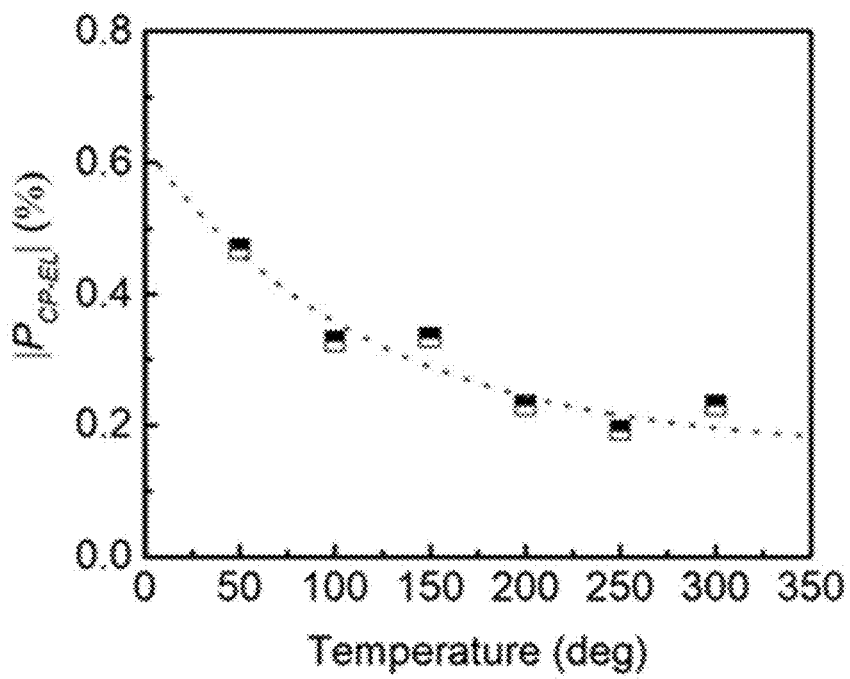
Figure 11:
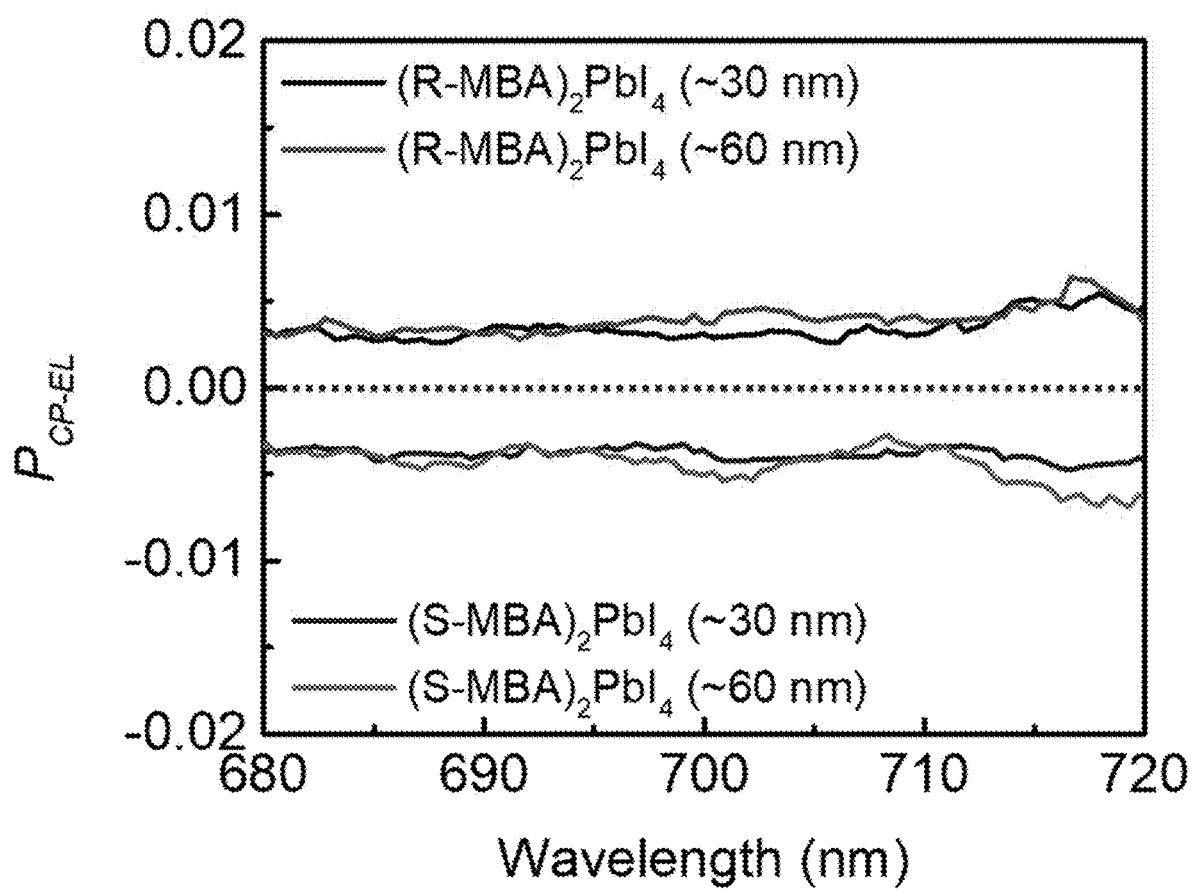
FIG. 11 provides P$_{CP-EL}$ of spin-LEDs based on CISS layers with different thickness (~30 nm and ~60 nm).
Figure 12A:
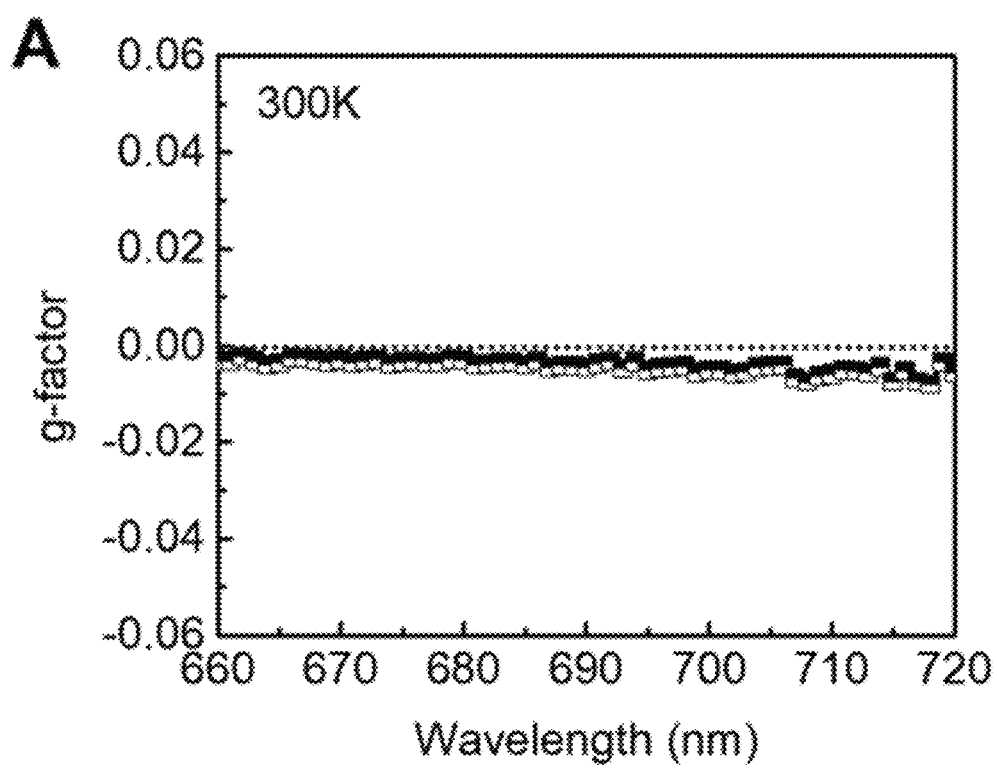
FIGS. 12A-12F provide P$_{CP-EL}$ of spin-LEDs based on (S-MBA)$_2$PbI$_4$/CsPbBr$_3$ NC heterostructure measured at (FIG. 12A) 300 K, (FIG. 12B) 250 K, (FIG. 12C) 200 K, (FIG. 12D) 150 K, (FIG. 12E) 100 K and (FIG. 12F) 50 K.
Figure 12B:
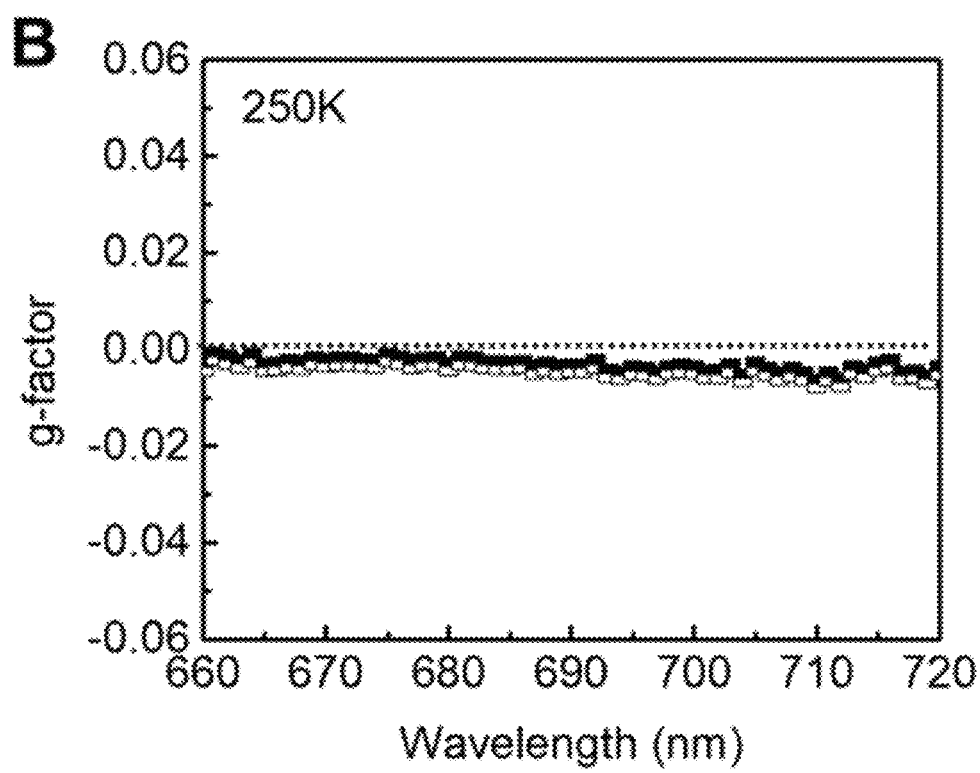
Figure 12C:
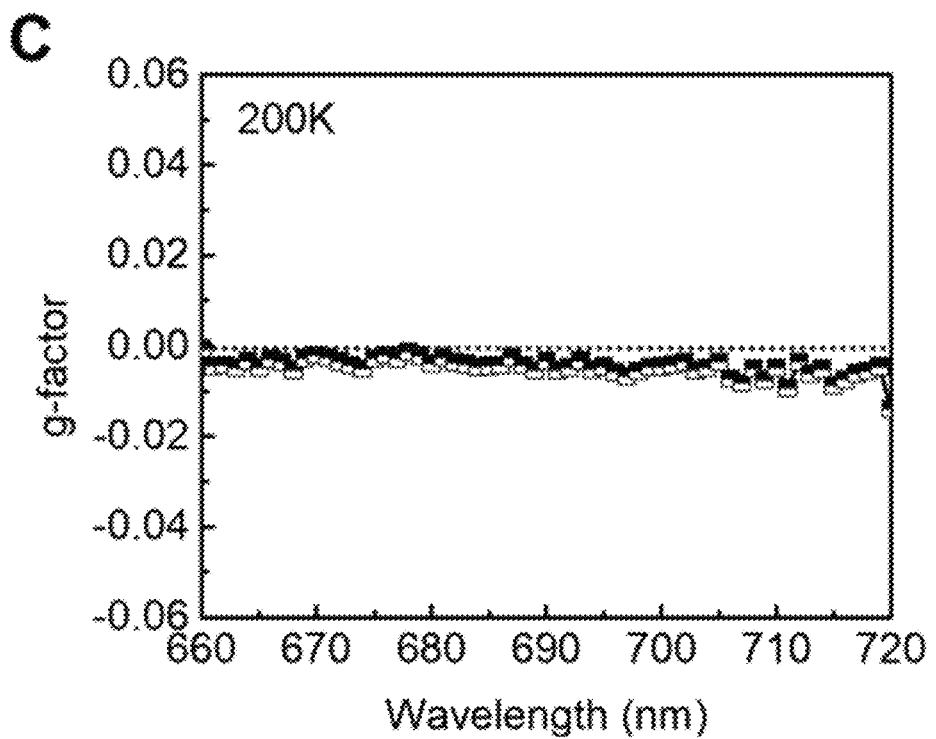
Figure 12D:
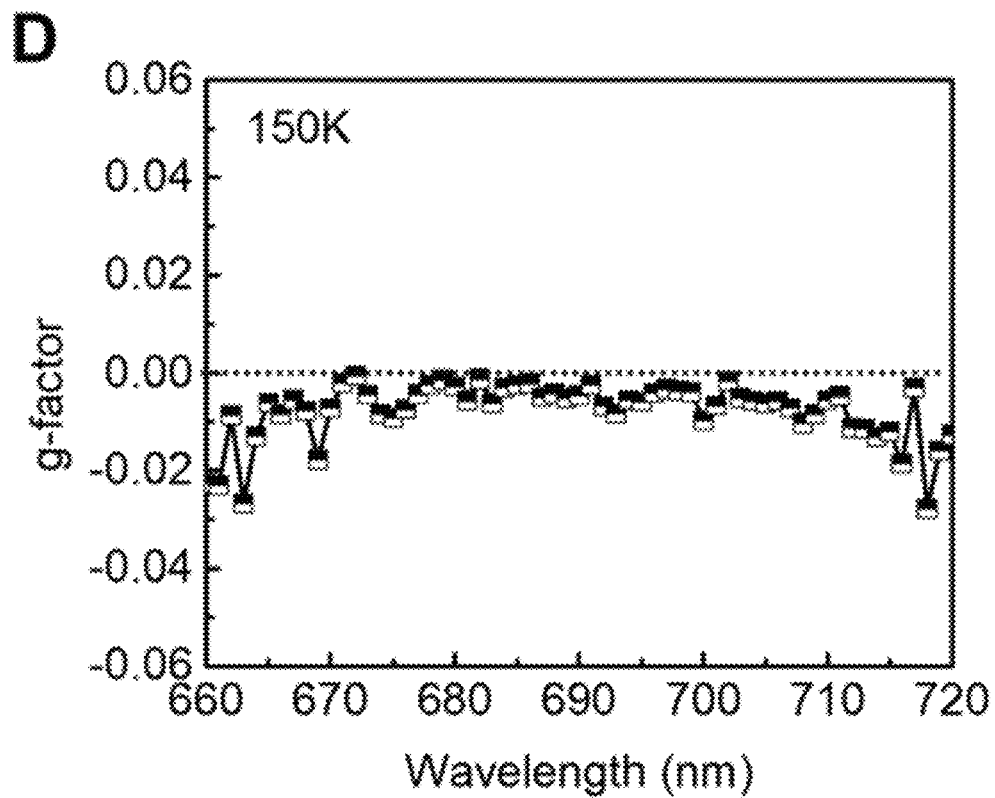
Figure 12E:
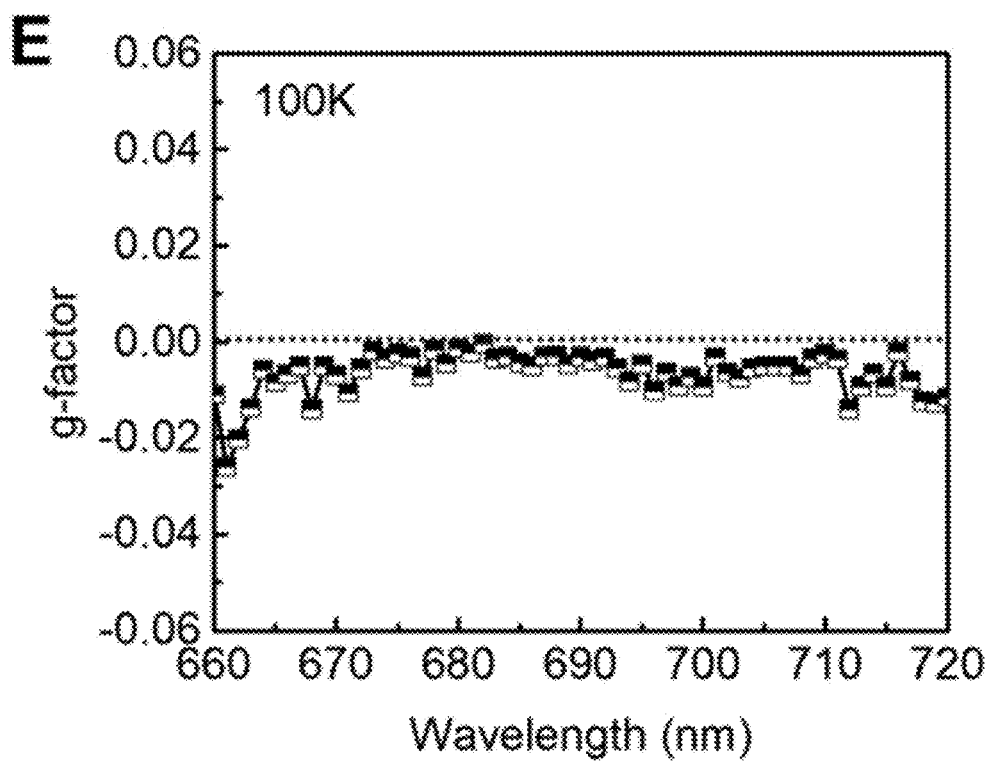
Figure 12F:
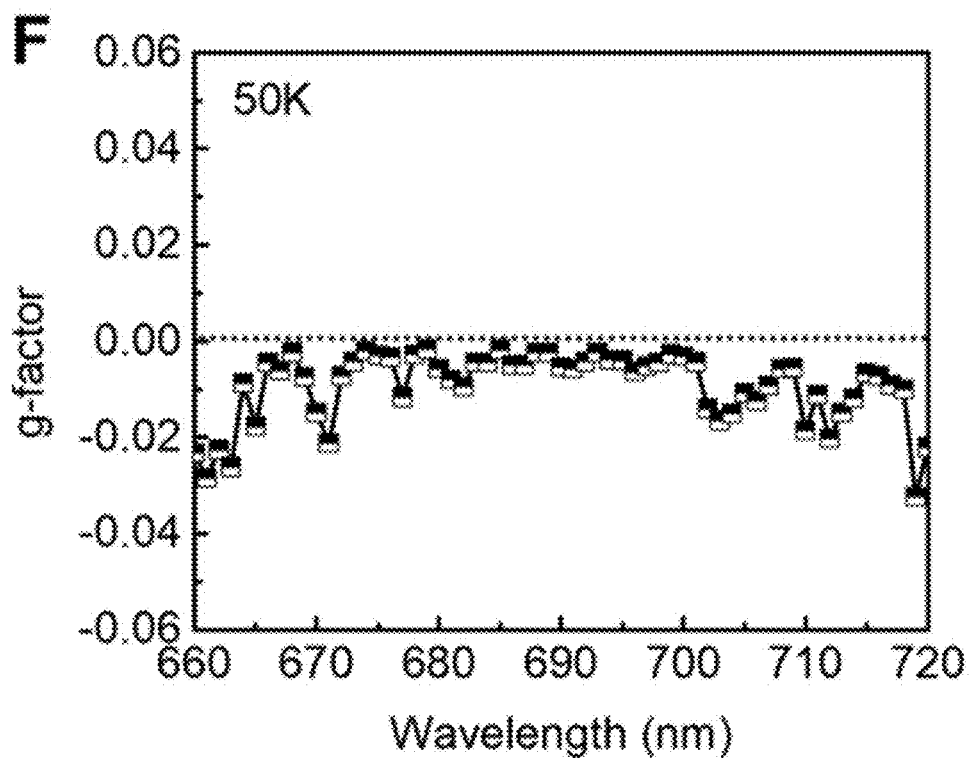

To study the $P_{CP-EL}$ properties in spin-LEDs, we measure $P_{CP-EL}$ at different temperatures (FIG. 2F, FIG. 11). As temperature decreases to 50 K, the spin-LEDs show a gradual |$P_{CP-EL}$| increase up to ~0.47%, due to the longer spin-dephasing time at low temperature coupled with concomitant increase in the radiative recombination rate of the spin-polarized carriers. This data suggests that further suppressing the spin-scattering of the spin-polarized carriers can increase $P_{CP-EL}$ in spin-LEDs at room temperature.

Figure 3A:
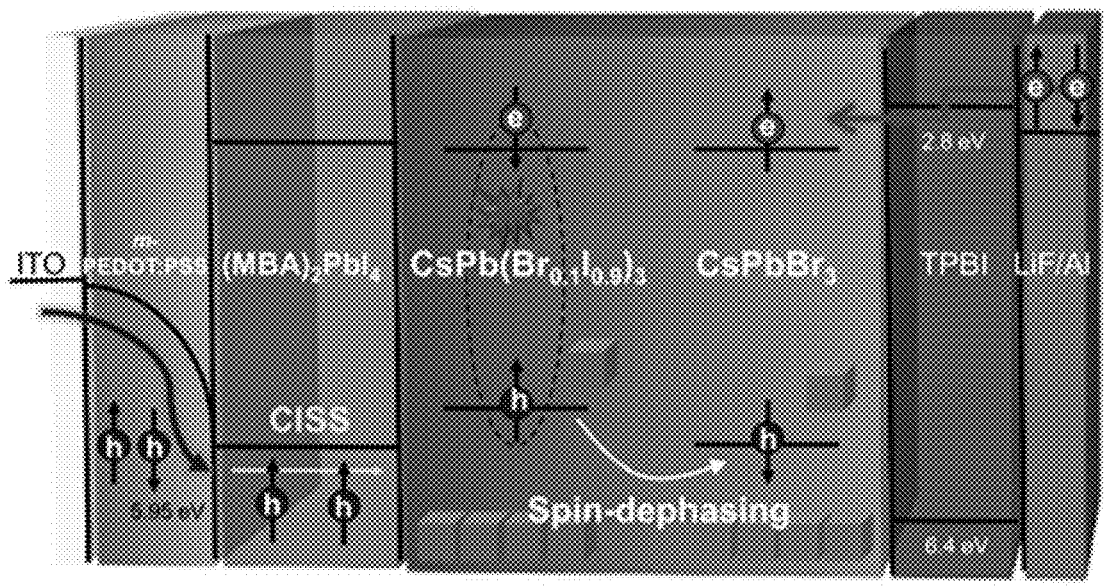
FIGS. 3A-3D provide CP-EL from mixed halide perovskite NCs.
Figure 3B:
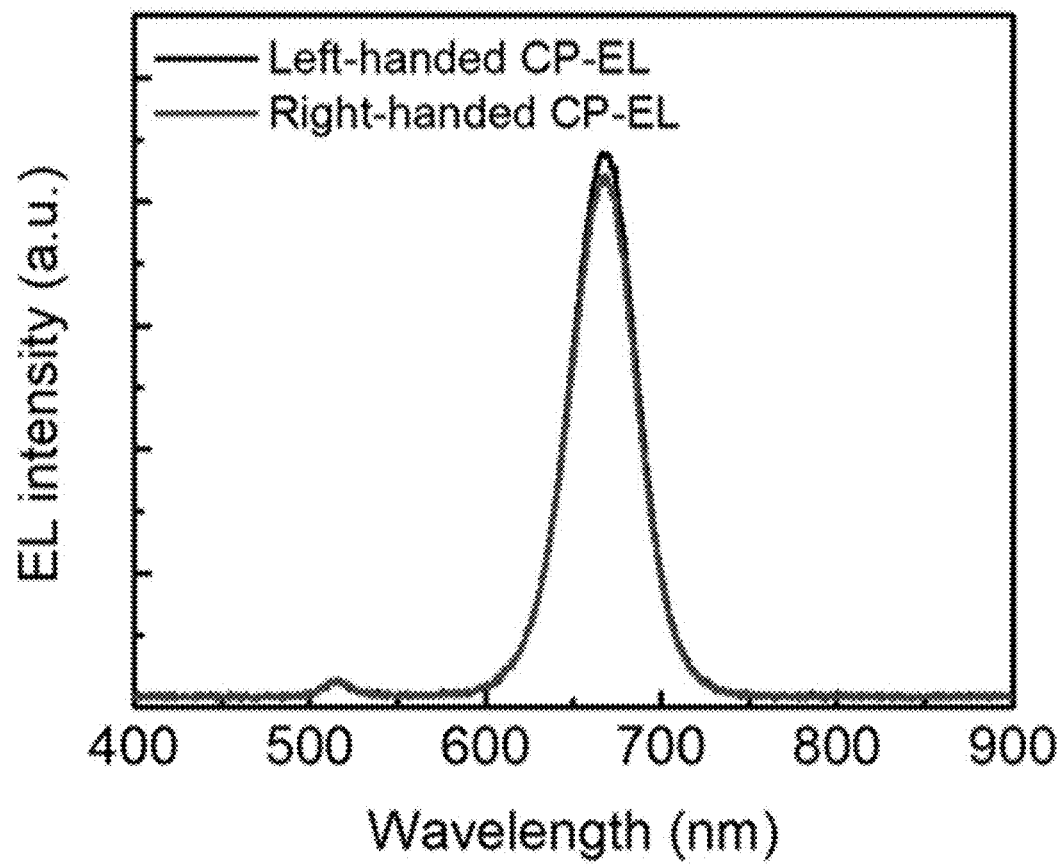
Figure 3C:
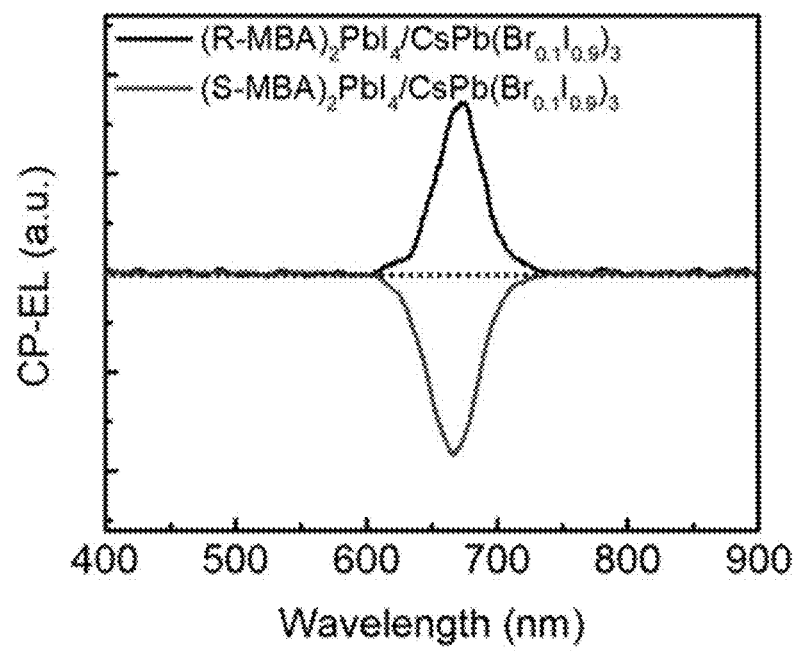
Figure 3D:
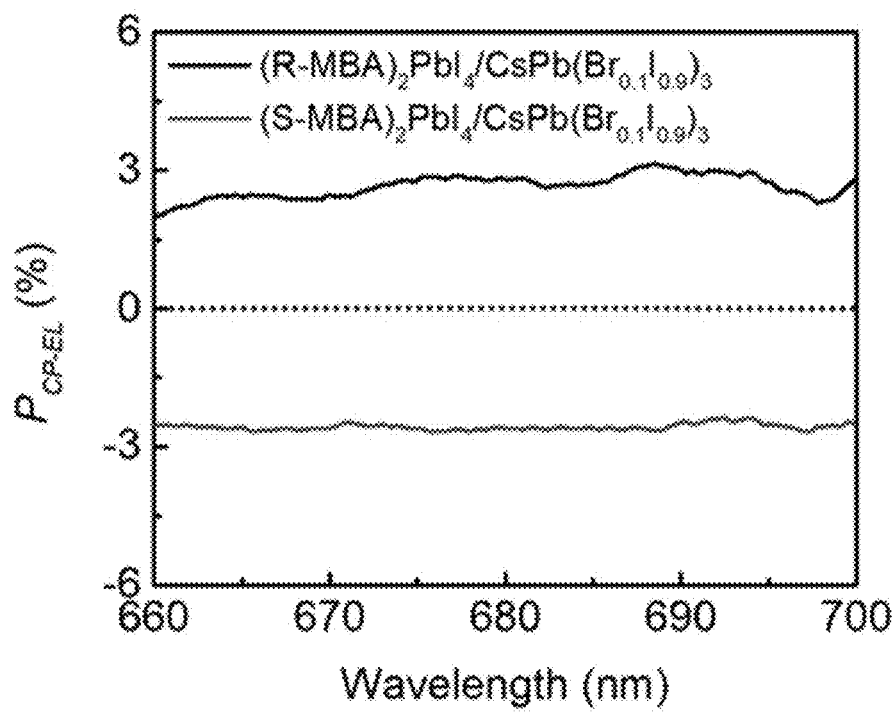
Figure 13:
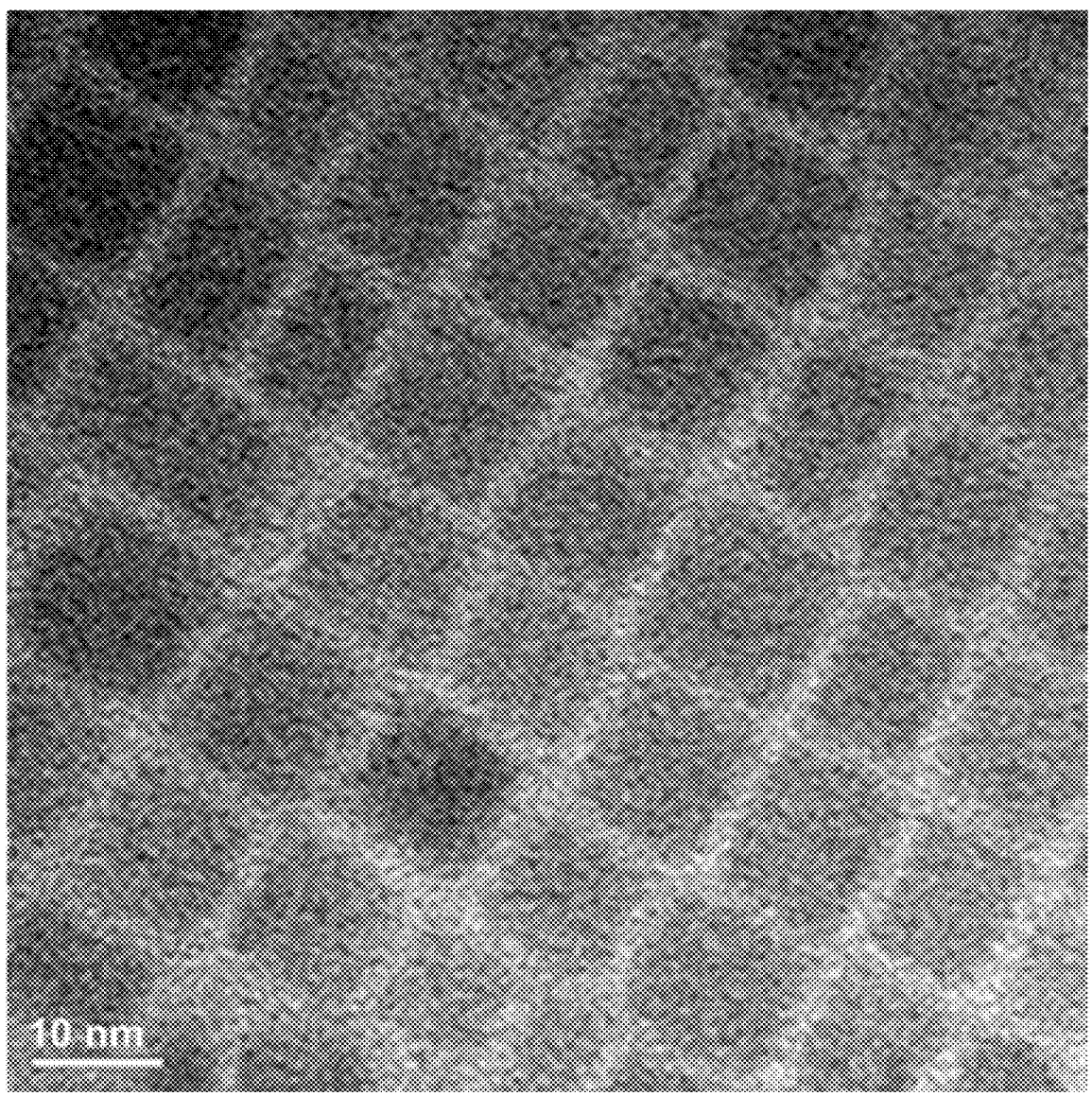
FIG. 13 provides a TEM image of colloidal CsPbBr$_3$ NCs.
Figure 14A:
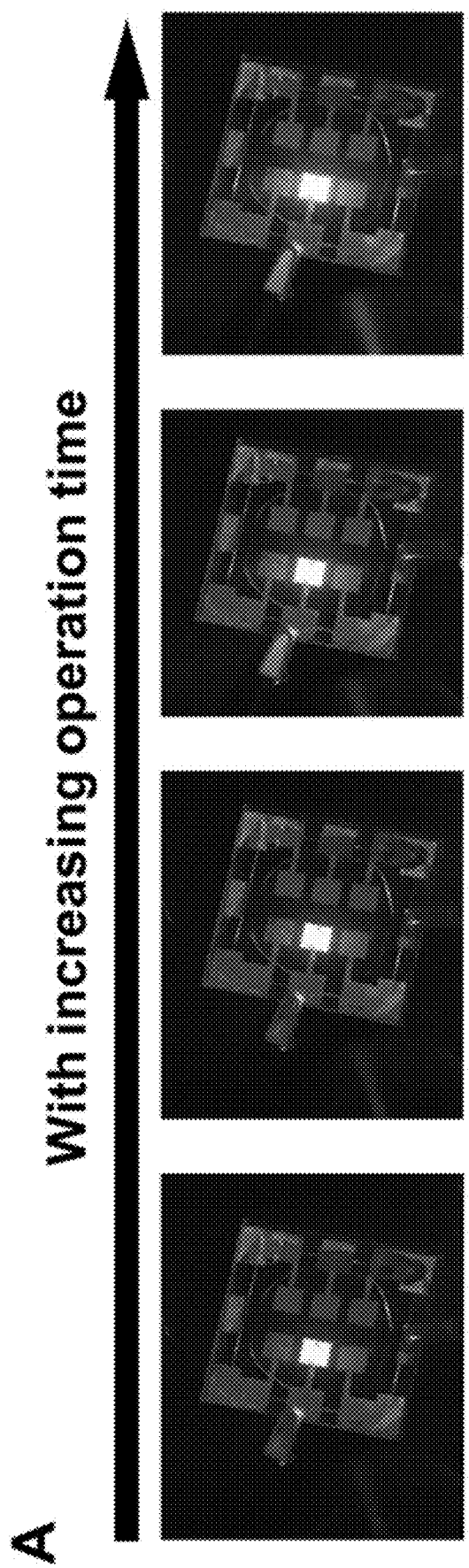
FIGS. 14A-14C provide Operation time dependent (FIG. 14A) photographs of operating devices, (FIG. 14B) normalized EL spectrum and (FIG. 14C) EL spectrum of spin-LEDs based on CsPbBr$_3$ NC films.
Figure 14B:
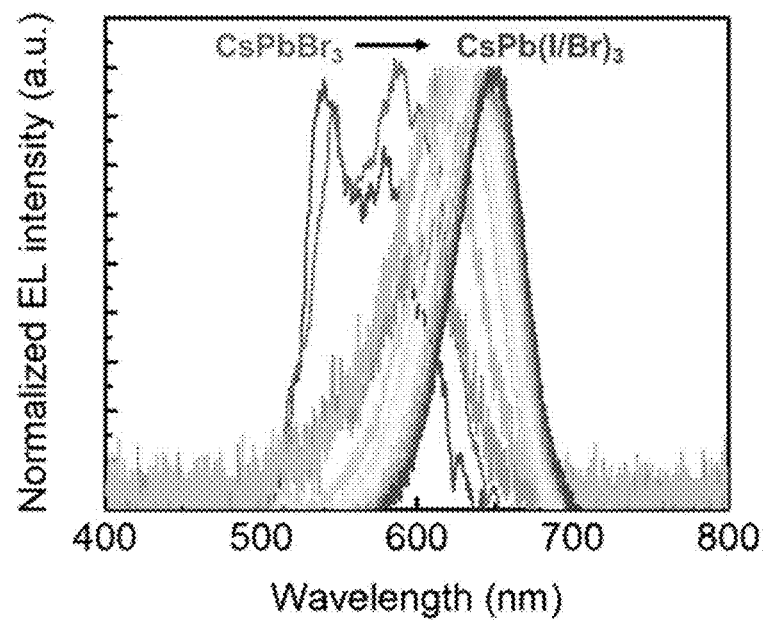
Figure 14C:
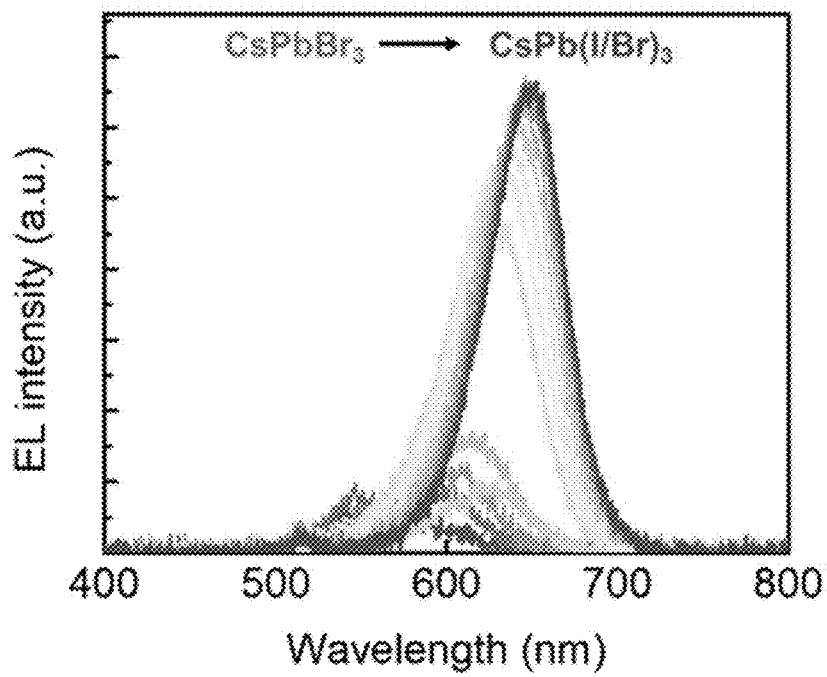
Figure 15:
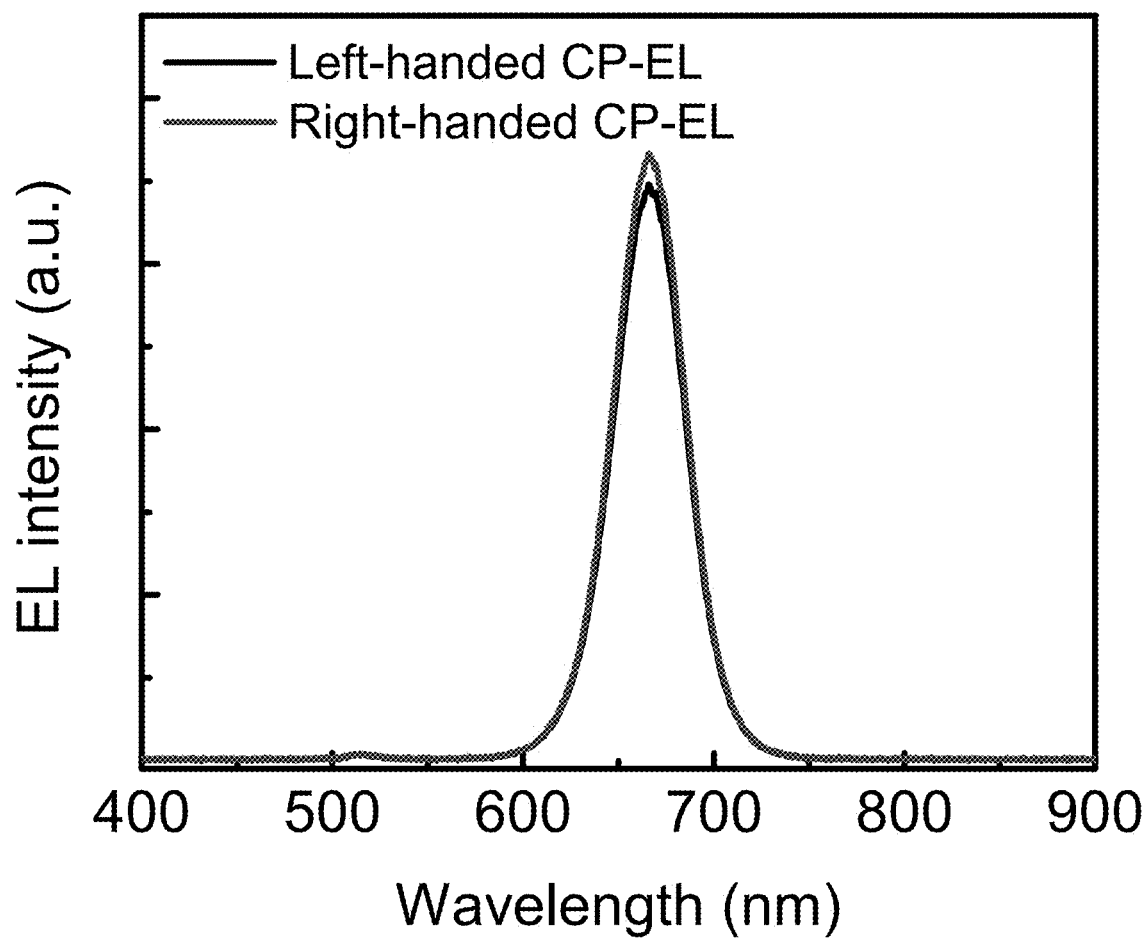
FIG. 15 provides left-handed and right-handed CP-EL spectrum of spin-LEDs based on (S-MBA)$_2$PbI$_4$ PC/CsPbBr$_3$ NC heterostructure.

We achieve a longer spin-coherence time and a concurrent improvement in the $P_{CP-EL}$ value by introducing a mixed-halide sample in the NC emitting layer. To accomplish this, we fabricate CsPbBr$_3$ NC (size ~10 nm, FIG. 12) instead of CsPbI$_3$ NC on top of the CISS layer. When a bias is applied to these devices, the external electric field drives a partial halide exchange between (R-/S-MBA)$_2$PbI$_4$ and CsPbBr$_3$ NC, resulting in an EL spectrum that redshifts with time (FIG. 3A, FIG. 13). The CP-EL signal is measured when the partial halide exchange saturates, i.e., when the EL peak no longer redshifts. We find that the EL peak saturates at 678 nm, corresponding to a final composition of CsPb(Br$_{0.1}$I$_{0.9}$)$_3$ according to its emission wavelength (FIG. 14). A small EL peak at 515 nm still remains that results from the pristine CsPbBr$_3$. This finding suggests that the halide exchange only occurs near the interface between the CISS layer and the NC layer. These spin-LEDs show a clear intensity difference between left- and right-circularly polarized EL emission at 678 nm; however, they do not show any CP-EL polarization at 515 nm (FIG. 3B, FIG. 15). For these devices, we calculate an average $P_{CP-EL}$=±2.6% at 660≤λ≤700 nm (FIGS. 3C-3D), which is substantially higher than that in the pure CsPbI$_3$ based spin-LEDs discussed above. We attribute the absence of CP-EL signal at 515 nm to two effects, (1) spin-polarized holes undergo an additional spin-dephasing when they are transferred to a deeper energy level of the CsPbBr$_3$ NCs (FIG. 3A) and (2) additional spin-scattering occurs as the carriers' transport into the film and away from the CISS/NC contact layer. Both effects indicate that carriers are highly polarized at the CISS/NC interface and our structure also promotes circularly-polarized light emission in the same spatial region. It has been hypothesized that one consequence of the spin-filter action of the CISS layer and Onsager reciprocity is that carriers with the wrong spin flip their polarization when reflected from the CISS layer. In our case, that process should tend to further polarize the carriers at the CISS/NC interface where circularly-polarized light emission occurs. This is the first spin-LEDs at room temperature without external magnetic field or magnetized electrode, which have $P_{CP-EL}$ comparable with the state-of-the-art GaAs based spin-LEDs (see Table 2).

TABLE 2

CP-EL emitting material (EML), spin-injection material, device structure, $P_{CP-EL}$ and CP-EL conditions of our devices, and previously reported spin-LEDs based on inorganic quantum well (QW) and quantum dot (QD), organics and perovskites.

| Emitting materials | Spin injection materials | Device structure | $P_{CP-EL}$ | CP-EL conditions |
|---|---|---|---|---|
| $CsPbI_3$ NC $CsPb(Br/I)_3$ NC Our works (perovskites) | (R-/S-MBA)$_2$PbI$_4$ | ITO/PEDOT:PSS:PFI/ (R-/S-MBA)$_2$PbI$_4$/ perovskite NC/TPBI/LiF/Al | 0.25% 2.6% | B = 0 Temperature = RT |
| AlGaAs/GaAs QW | BeMnZnSe | p-GaAs/p-AlGaAs/i-GaAs/n-AlGaAs/BeMnZnSe/BeMgZnSe | 43% | B > 3 T Temperature = 5 K |
| GaAs/InGaAs QW | p-GaMnAs | n-GaAs/i-GaAs/i-InGaAs/i-GaAs/p-GaMnAs | ~8% | B = 1,000 Oe Temperature = 6 K |
| GaAs/InGaAs QW | Fe | p-GaAs/i-GaAs/InGaAg/i-GaAs/n-GaAs/Fe/Al | 2% | B > 4 T Temperature = RT |
| AlGaAs/GaAs QW | Fe | Fe/n-AlGaAs/GaAs/p-AlGaAs | 13% | B = 3 T Temperature = 4.5 K |
| AlGaAs/GaAs QW | CoFe/NiFe | p-GaAs/p-AlGaAs/GaAs/ AlGaAs/AlO$_x$/CoFe/NiFe/Cu | 2.3% | B > 0.5 T Temperature = 80 K |
| AlGaAs/GaAs QW | Co$_{70}$Fe$_{30}$ | p-GaAs/p-AlGaAs/i-AlGaAs/GaAs/i-AlGaAs/GaAs/ MgO/CoFe/Ta/MgO | 57% 47% | B = 5 T Temperature = 100 K, 290 K |
| AlGaAs/GaAs QW | Co$_{70}$Fe$_{30}$ | p-GaAs/p-AlGaAs/AlGaAs/GaAs/AlGaAs/ p-AlGaAs/GaAs/ Al/MgO/CoFc/Ta | ~45% | B = 0.8 T Temperature = 10 K-RT |
| AlGaAs/GaAs QW | Fe | p-GaAs/p-AlGaAs/i-AlGaAs/ i-GaAs/i-AlGaAs/ n-AlGaAs/Fe/Al | ~30% 6% | B = 2.5 T Temperature = 2 K, RT |
| AlGaAs/GaAs QW | Co$_2$MnGe | p-GaAs/p-AlGaAs/i-AlGaAs/i-GaAs/i-AlGaAs/n-AlGaAs/Co$_2$MnGe/Al | 14% | B = 2.5 T Temperature = 2 K |
| AlGaAs/GaAs QW | Co$_2$FeSi | p-GaAs/p-AlGaAs/GaAs/ n-AlGaAs/Co$_2$FeSi | 15% | B > 1 T Temperature = 20 K |
| AlGaAs/GaAs QW | Fe | p-GaAs/p-AlGaAs/p-GaAs/ i-AlGaAs/n-AlGaAs/ n-GaAs/AlO$_x$/Fe/Au/Ti | 95% | B = 5 kOe (pre-magnetization) Temperature = RT |
| GaN/InGaN QW | Ni | n-GaN/Ni/n-GaN/InGaN with Fe$_3$O$_4$ nanoparticles/GaN/ p-GaN/Ni/Au | 11% | B = 0.35 T Temperature = RT |
| GaAs/InGaAs QW | (Ga, Mn)As | Si-GaAs/p-GaAs/GaAs/InGaAs/GaAs/n-GaAs/(Ga, Mn)As | 0.8% | B = 3 kG Temperature = 5 K |
| GaAs/InGaAs QW | (Ga, Mn)As | n-GaAs/i-GaAs/InGaAs QW/ i-GaAs/p-(Ga, Mn)As/Ti/Au | 7% | B = 5 kOe Temperature ~5 K |
| GaAs/InGaAs QW | ZnMnSe:Cl | GaAs/InGaAs QW/GaAs/ZnMnSe:Cl | 35% | B > 6 T Temperature = 5 K |
| AlGaAs/GaAs QW | CdCr$_2$Se$_4$ | p-GaAs/p-AlGaAs/GaAs/n-AlGaAs/CdCr$_2$Se$_4$ | 6% | B > 0.5 T Temperature = 5 K |
| AlGaAs/GaAs QW | Co, Fe, NiFe | p-GaAs/p-AlGaAs/AlGaAs/GaAs/AlGaAs/ n-AlGaAs/Al$_2$O$_3$/Co, Fe, NiFe | 1% | B = 1.3 T Temperature = RT |
| AlGaAs/GaAs QW | CoFe | p-GaAs/p-AlGaAs/GaAs/AlGaAs/AlOx/ CoFe/NiFe/Cu | 24%, 12% | B > 0.8 T Temperature = 80 K, 300 K |
| GaAs/InGaAs QW | MnAs | p-GaAs/InGaAs/GaAs/n-GaAs/MnAs | 1.5% | B > 2 T Temperature = 80 K |
| GaAs/InGaAs QW | Co$_{2.4}$Mn$_{1.6}$Ga | p-GaAs/GaAs/InGaAs/GaAs/n-GaAs/n-AlGaAs/ Co$_{2.4}$Mn$_{1.6}$Ga/Au | 13% | B > 0.5 T Temperature = 5 K |
| AlGaAs/GaAs QW | ZnMnSe | p-GaAs/p-AlGaAs/GaAs/n-AlGaAs/ZnMnSe/Ti/Au | 50% | B > 4 T Temperature = 4.2 K |
| Si | Fe | p-Si/p-Si/i-Si/n-Si/Fe | 2% | B = 3 T Temperature = 80 K |
| AlGaAs/GaAs QW | MnGa | p-GaAs/p-AlGaAs/ i-AlGaAs/GaAs/i-AlGaAs/ n-AlGaAs/MnGa/Al | 5% | B = 50 kOe (pre-magnetization) Temperature = 20 K |

TABLE 2-continued

CP-EL emitting material (EML), spin-injection material, device structure, $P_{CP-EL}$ and CP-EL conditions of our devices, and previously reported spin-LEDs based on inorganic quantum well (QW) and quantum dot (QD), organics and perovskites.

| Emitting materials | Spin injection materials | Device structure | $P_{CP-EL}$ | CP-EL conditions |
|---|---|---|---|---|
| GaAs/InGaAs QW | Tb:Fe | p-GaAs/i-GaAs/GaInAs QW/n-GaAs/Fe/Tb:Fe/Cr | ~2% | B = 3 T (pre-magnetization), Temperature = 90 K |
| AlGaAs/GaAs QW | Fe | p-GaAs/p-AlGaAs/GaAs/ n-AlGaAs/Al$_2$O$_3$/Fe | ~20% | B = 3 T Temperature = 5 K |
| InAs QD | Zn$_{0.96}$Mn$_{0.04}$Se | p-ZnGaAs/GaAs/InAs QD/GaAs/i-ZnMnSe/p-ZnMnSe/ZnSe | 60% | B = 5 T Temperature = 3.7 K |
| In$_{0.4}$Ga$_{0.6}$As QD | InAs:Mn | n-GaAs/i-GaAs/InGaAs QD/ i-GaAs/InAs:Mn/p-GaAs/GaAs | 5.8% | B = 5 kOe Temperature = 28 K |
| InAs QD | (Ga, Mn)As | (Ga, Mn)As/GaAs/InAs QD/GaAs/GaAs:Si/Ti:Au | ~1% | B = 0.35 T Temperature = 5 K |
| InAs/GaAs QDs | Fe | p-GaAs/p-AlGaAs/GaAs/InAs-GaAs QD/n-AlGaAs/Fe | 5% | B = 3 T Temperature = 80-300 K |
| InAs:GaAs QD | Fe | p-GaAs/p-AlGaAs/GaAs/InAs:GaAs QD/n-AlGaAs/Fe | 7.5% | B > 50 mT Temperature = 15 K |
| D-DOO-PPV (organics) | LSMO, Co | LSMO/D-DOO-PPV[k]/LiF/Co/Al | 1.1% | B = 4-30 mT Temperature = 10 K |
| MAPbBr$_3$ (perovskite) | LSMO | LSMO[l]/MAPbBr$_3$/TPBI/Al | 0.8% | B = 150 mT Temperature = 10 K |

[k]D-DOO-PPV: deuterated poly(dioctyloxy)phenyl vinylene;
[l]LSMO: La$_{0.7}$Sr$_{0.3}$MnO$_3$, TPBI: 2,2',2''-(1,3,5-benzinetriyl)-tris (1-phenyl-1-H-benzimidazole)

The first spin-LEDs were demonstrated based on epitaxially grown magnetic semiconductors; spin-polarized holes were injected through (Ga,Mn)As, or spin-polarized electrons were injected through BeZnMnSe; injected spin-polarized charge carriers recombine with their conjugates from the non-polarized population that resulted of CP-EL emission from InGaAs/GaAs or AlGaAs/GaAs quantum wells at low temperature (<10 K) and under magnetic fields. In addition to magnetic semiconductors, ferromagnetic metals have been developed to improve upon the spin injecting electrodes that enabled CP-EL at various temperatures (2-300 K), but these approaches still require the application of an external magnetic fields to set the magnetic orientation to inject spin-polarized charge carriers (or polarize the injected carriers). In addition, ultra-high vacuum (<10$^{-8}$ Torr) is required to grow the epitaxial semiconductor (e.g., AlGaAs/GaAs, InGaN/GaN) quantum wells or epitaxial quantum dot emitting layers well as the ferromagnetic contacts. Therefore, the described devices that work without external magnetic field or ferromagnetic device element and at room temperature, which are solution-processable, provide significant advantages.

Figure 4A:
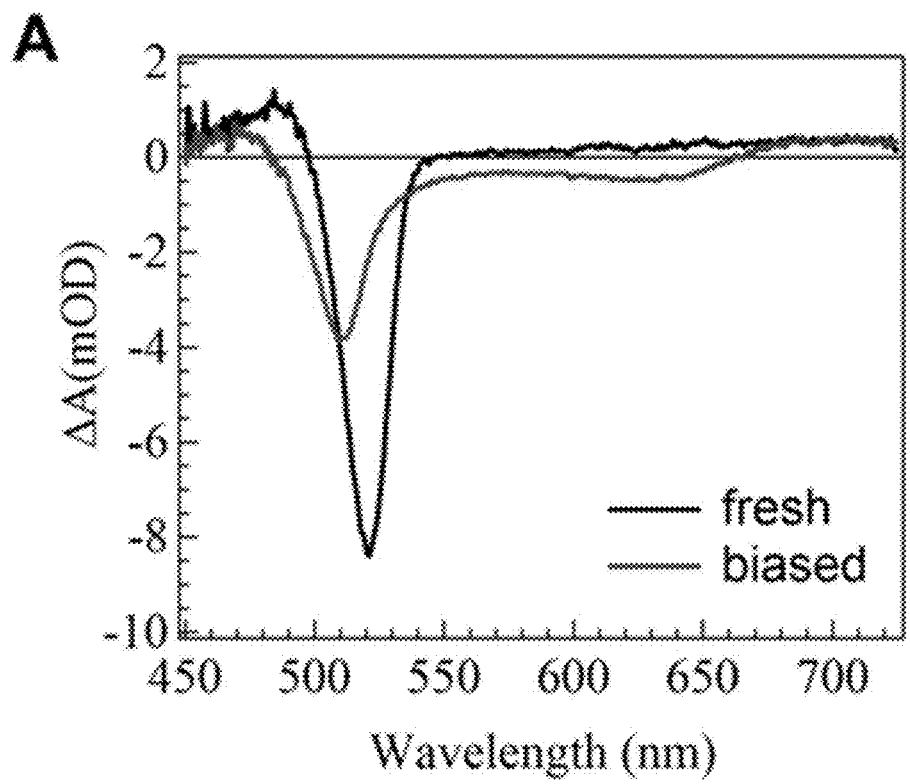
FIGS. 4A-4D provide Charge and spin dynamics in NCs.
Figure 16:
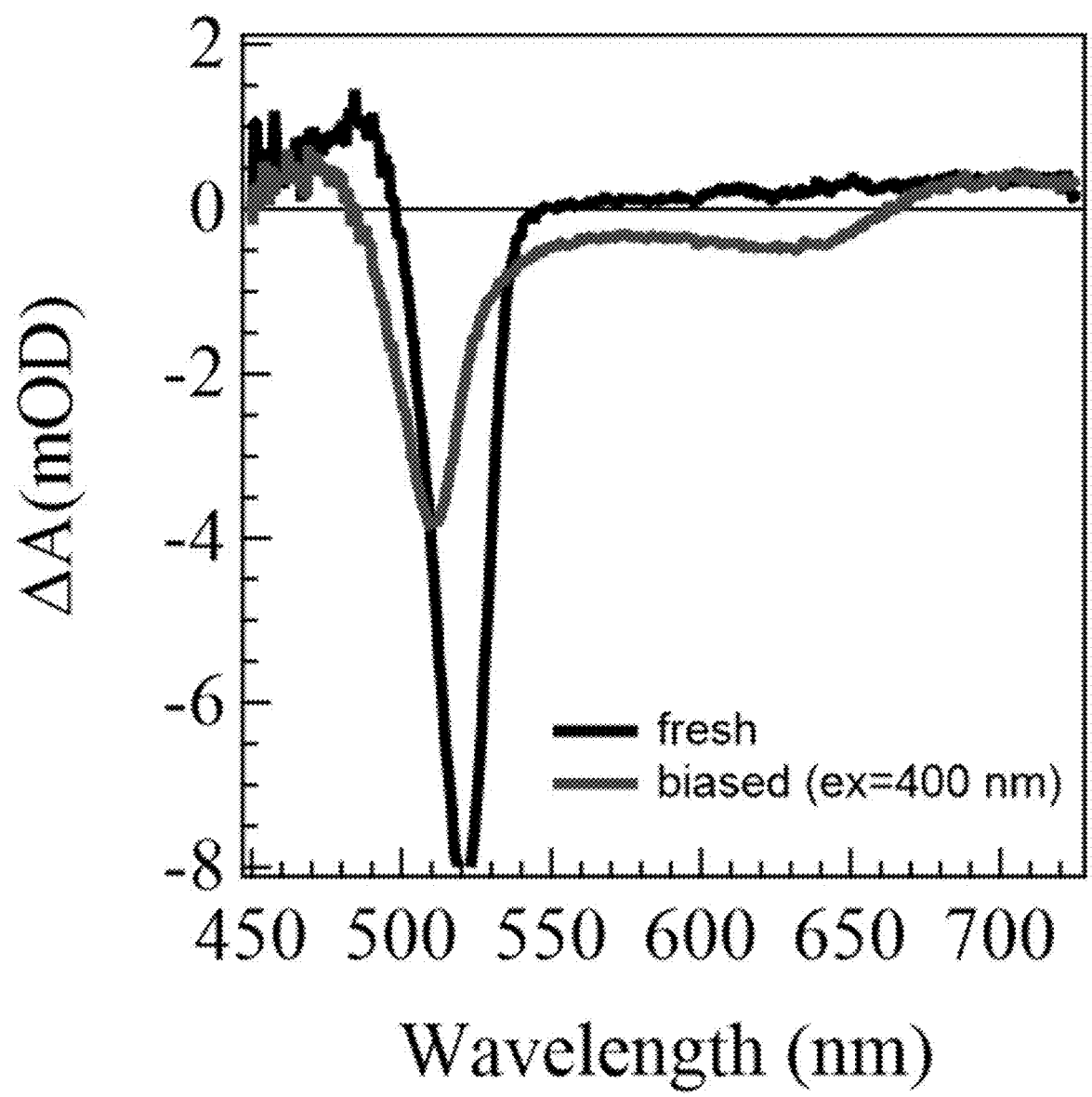
FIG. 16 provides transient absorption (TA) spectra of spin-LEDs before and under applied bias. The pump wavelength was selected at 400 nm.
Figure 17A:
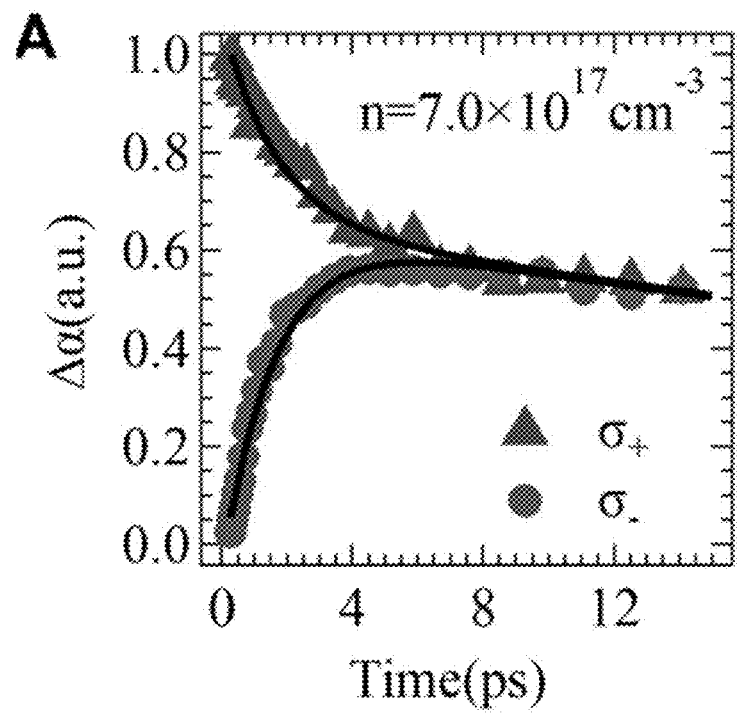
FIGS. 17A-17D provide spin coherence dynamics of CsPb(Br$_{0.1}$I$_{0.9}$)$_3$ NC films measured at different excitation carrier density.
Figure 17B:
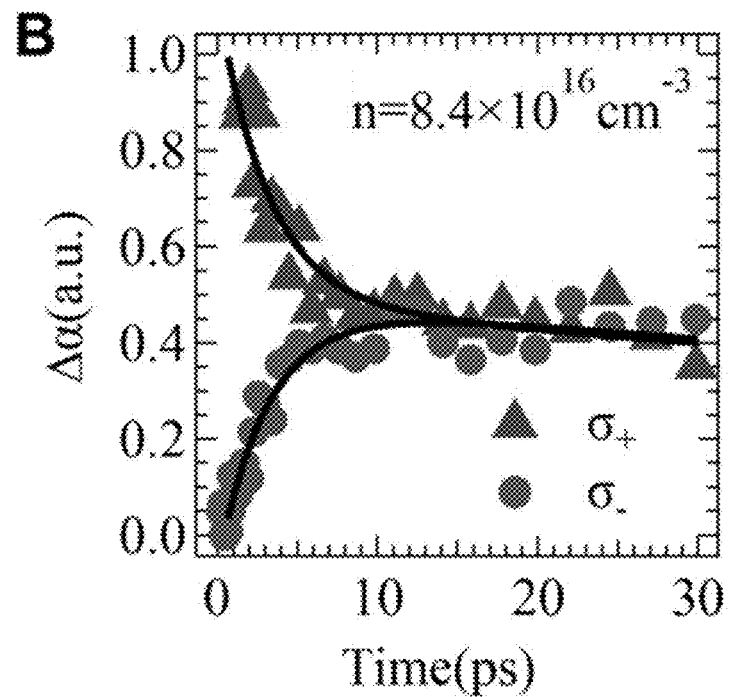
Figure 17C:
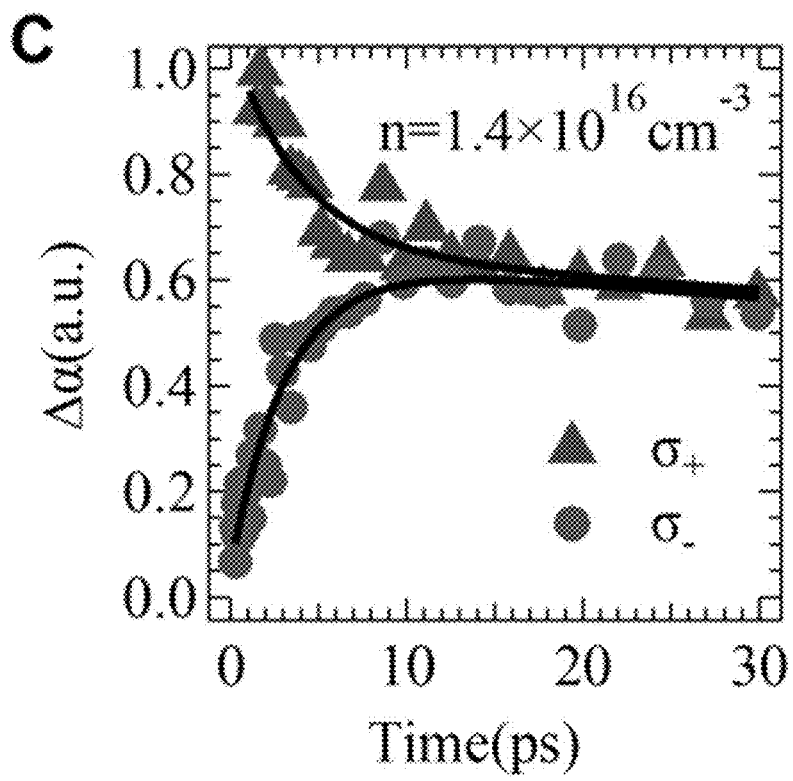
Figure 17D:
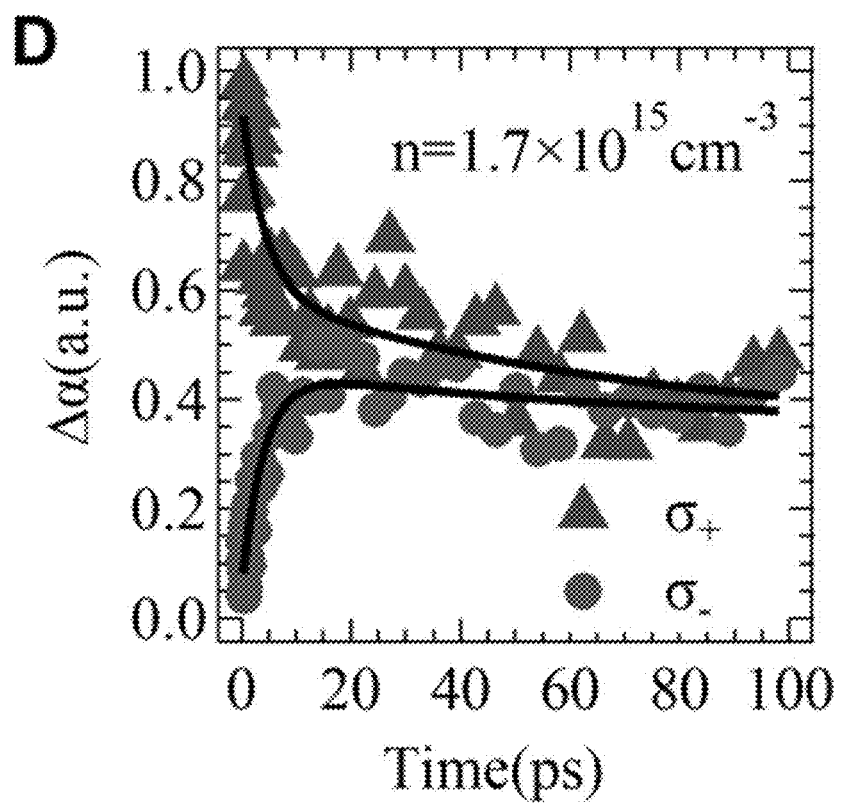
Figure 18A:
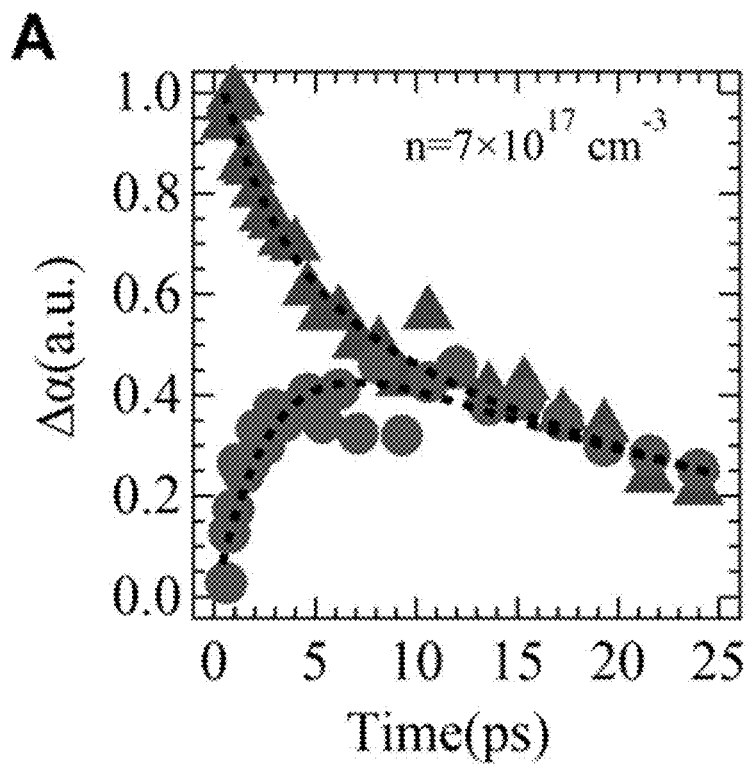
FIGS. 18A-18D provide spin coherence dynamics of CsPbI$_3$ NC films measured at different excitation carrier density.
Figure 18B:
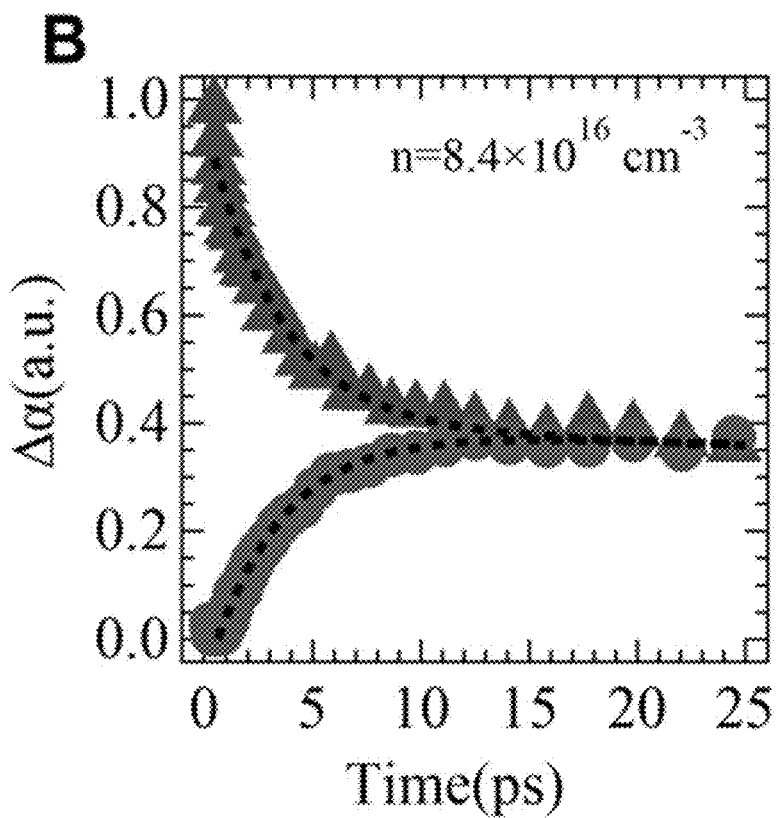
Figure 18C:
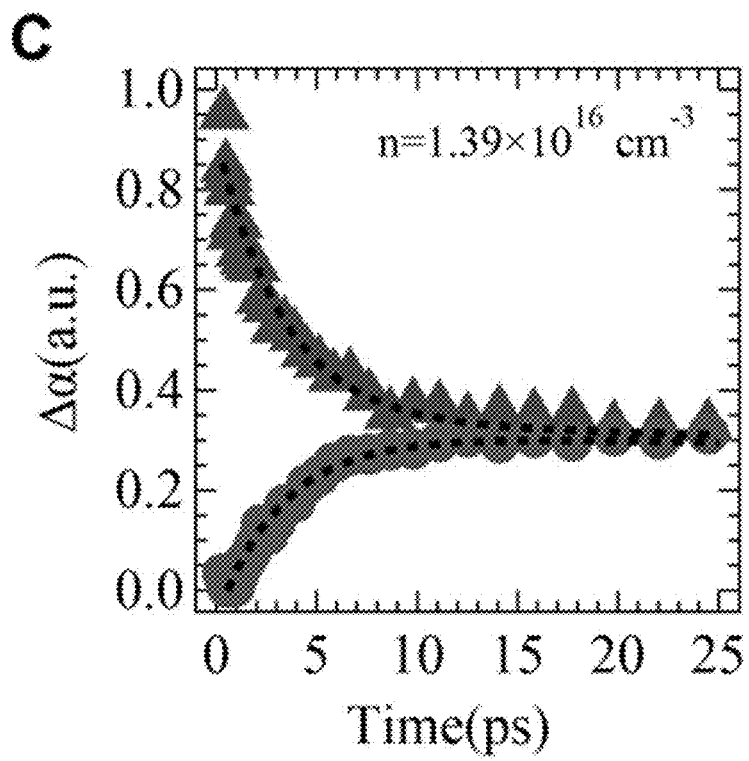
Figure 18D:
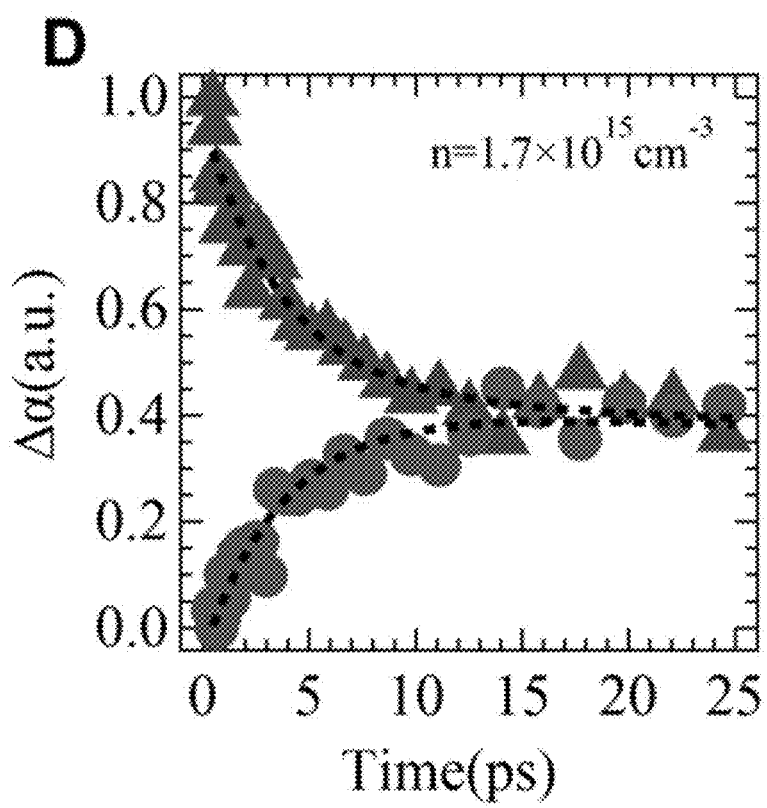

To better understand the electric field-driven halide exchange and the resulting light emission from the mixed-halide NCs in spin-LEDs, we measured TA of the spin-LED devices based on CISS/CsPbBr$_3$ NC heterostructure before and upon applying a bias (FIG. 4A, FIG. 16). Fresh spin-LEDs without bias show a single photobleaching (PB) peak at 510 nm which corresponds to the exciton transition of CsPbBr$_3$. Under the applied bias, a new PB peak is formed at 650 nm while the PB peak at 510 nm substantially decreases (FIG. 4A). This PB feature can also be observed when we excite the spin-LED devices using a pump photon energy below the bandgap of the CsPbBr$_3$ NCs (FIG. 16), confirming the formation of mixed-halide NCs. The relative intensities of the PB feature at 510 nm vs. 650 nm suggest that after the voltage driven halide exchange, ~80% of the NCs remains as CsPbBr$_3$, while only ~20% is converted to CsPb(Br$_{0.1}$I$_{0.9}$)$_3$. By contrast, in the EL measurements (FIG. 3B) the EL emission is dominated by NCs with mixed anions. In addition in the TA experiments over the course of ~1 ns, we do not observe, photocarrier migration from the CsPbBr$_3$ to the CsPb(Br$_{0.1}$I$_{0.9}$)$_3$, but recall that in an EL measurement polarized holes are injected at the CISS/CsPb (Br$_{0.1}$I$_{0.9}$)$_3$ and need extra energy to be promoted and transmitted to the CsPbBr$_3$ region, while the conduction band is relatively flat allowing for electrons to flow through the CsPbBr$_3$ region to the CsPb(Br$_{0.1}$I$_{0.9}$)$_3$ (FIG. 3A). Consequently, the device promotes circularly-polarized light emission at the CISS/NC interface, where the carriers are highly polarized both from injection of the polarized holes coming from the CISS layer, as well as spin-polarization that occurs from reflection of electrons at the CISS/NC interface, as discussed herein.

Figure 4B:
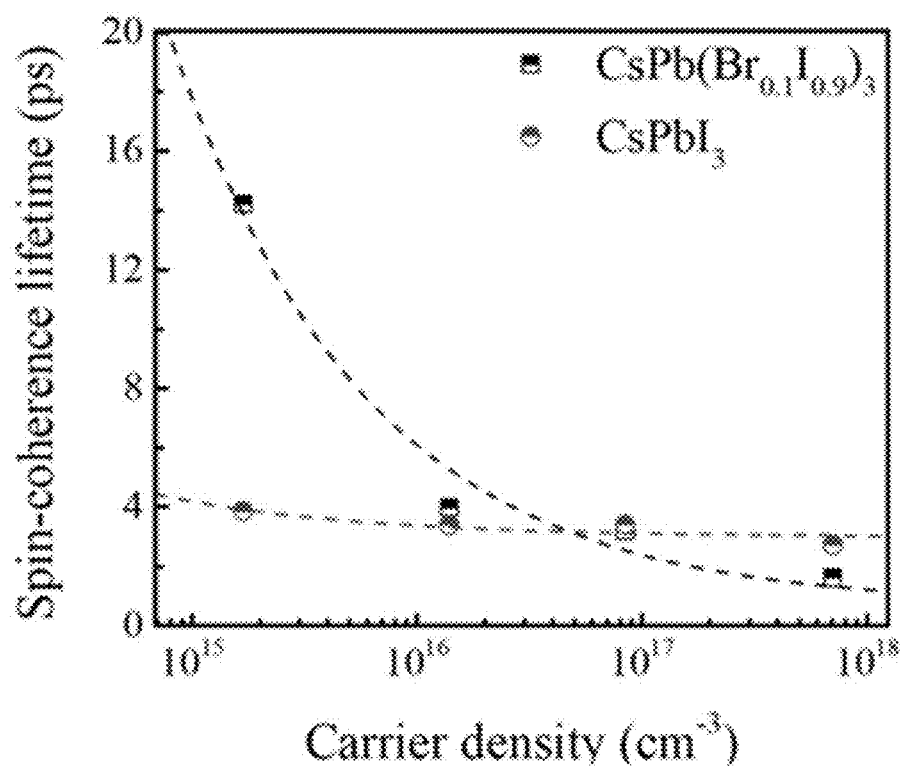
Figure 4C:
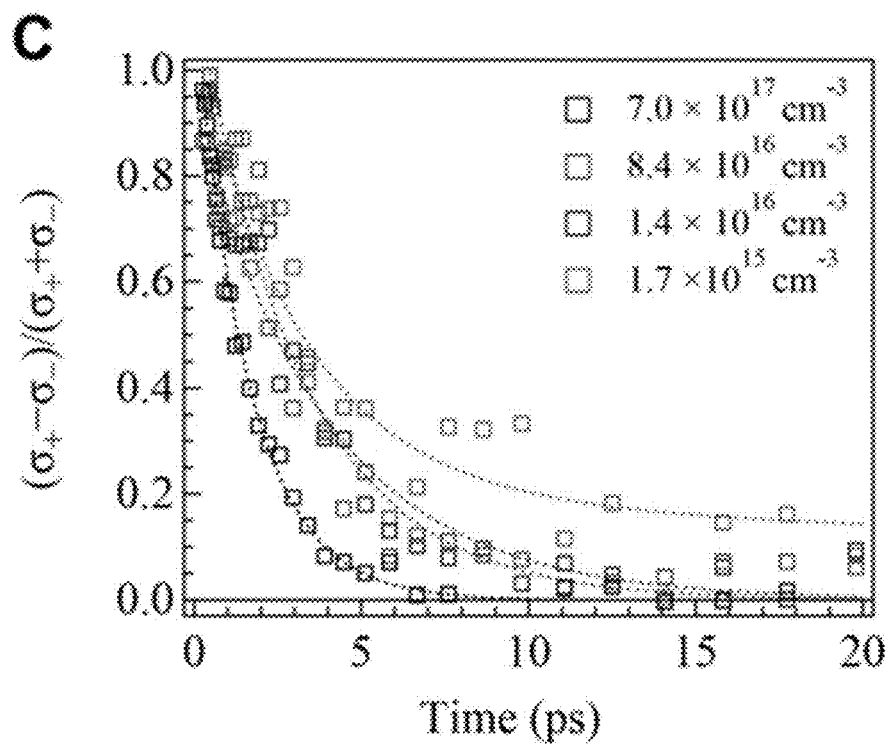
Figure 4D:
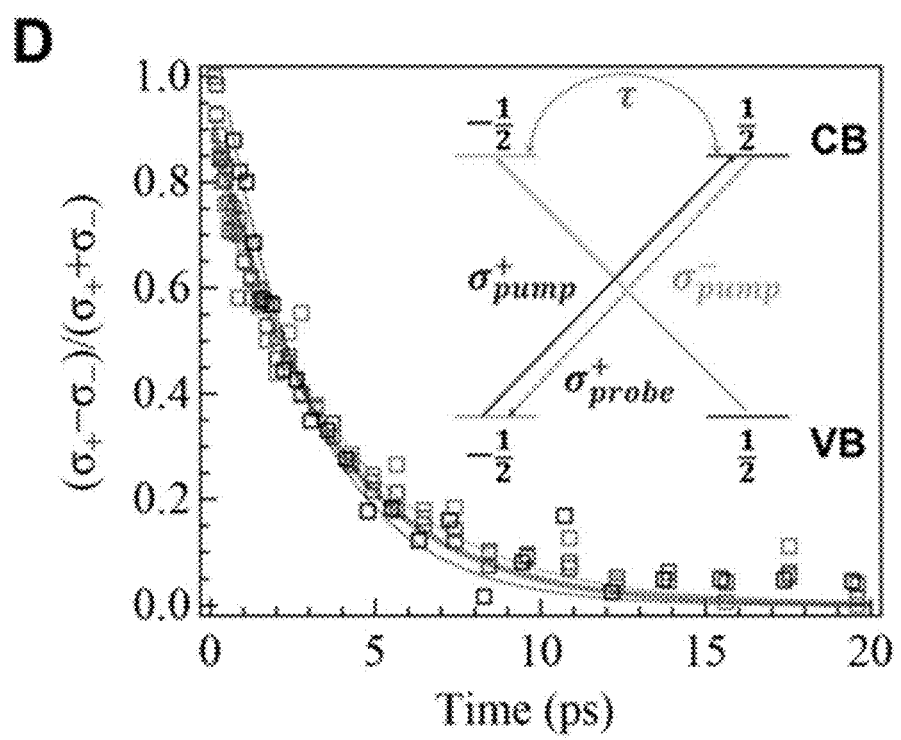
Figure 5A:
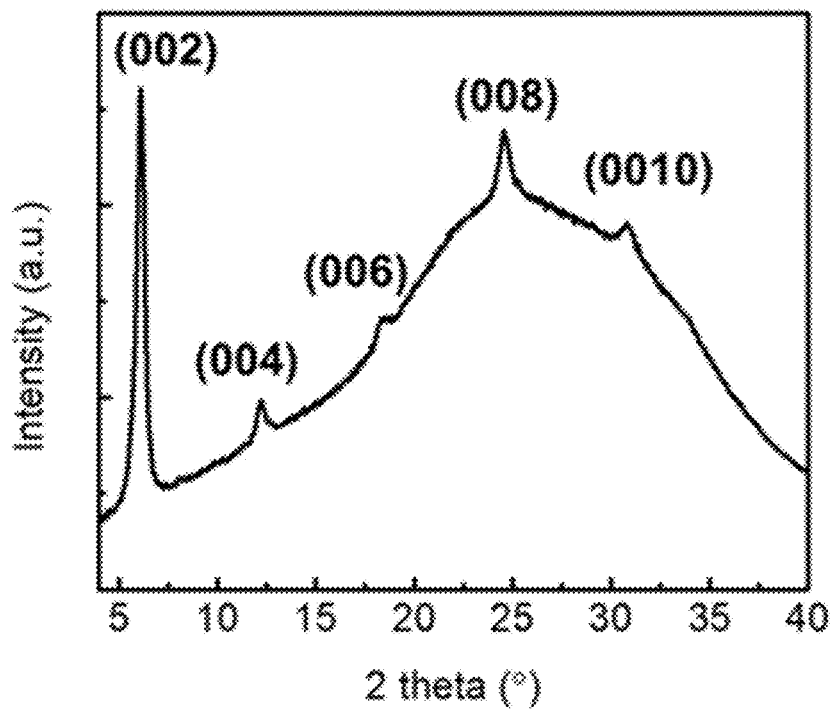
FIGS. 5A-5F provide XPD spectra and corresponding 2D XRD patterns of (FIG. 5A-B) (R-MBA)$_2$PbI$_4$, (FIG. 5C-5D) (S-MBA)$_2$PbI$_4$ and (FIG. 5E-5F) (rac-MBA)$_2$PbI$_4$ films coated on m-PEDOT:PSS.
Figure 5B:
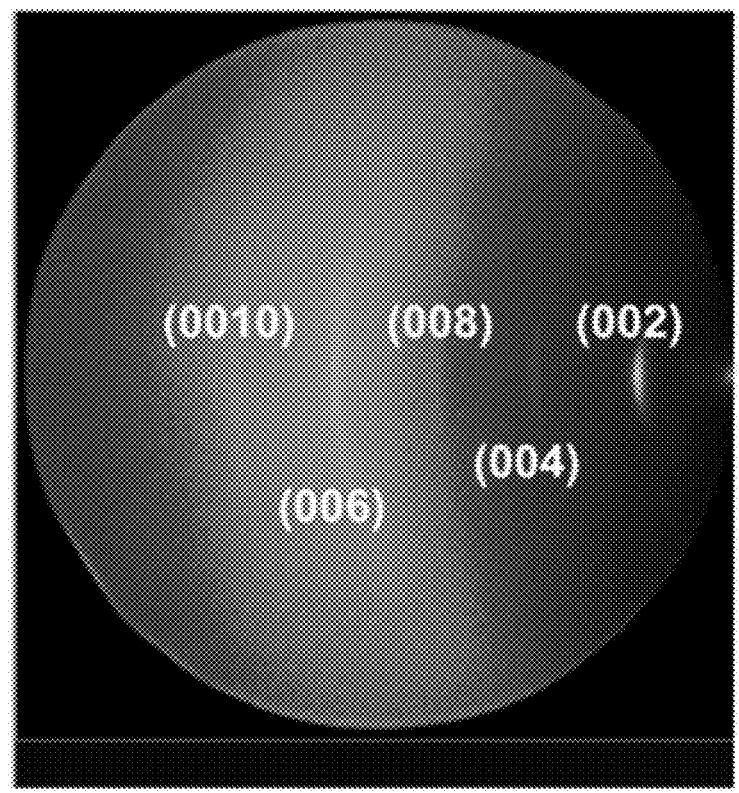
Figure 5C:
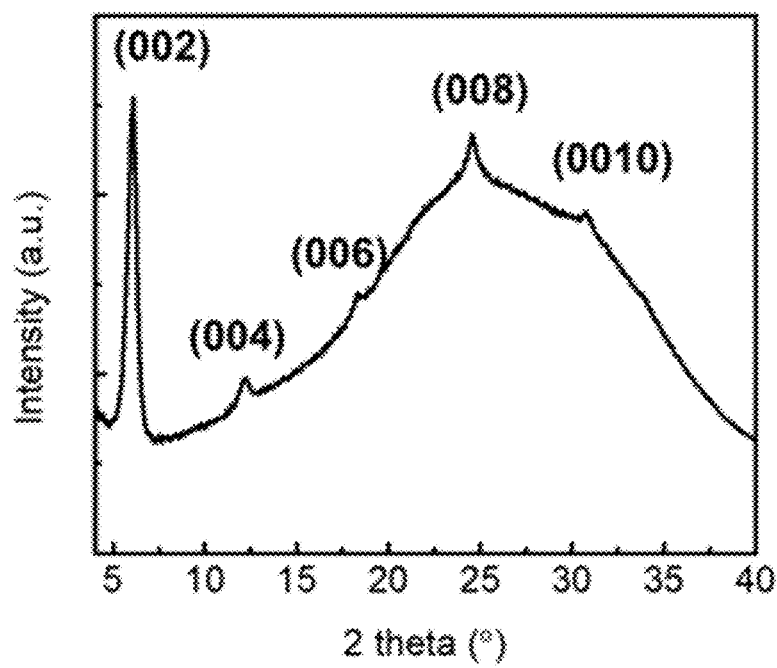
Figure 5D:
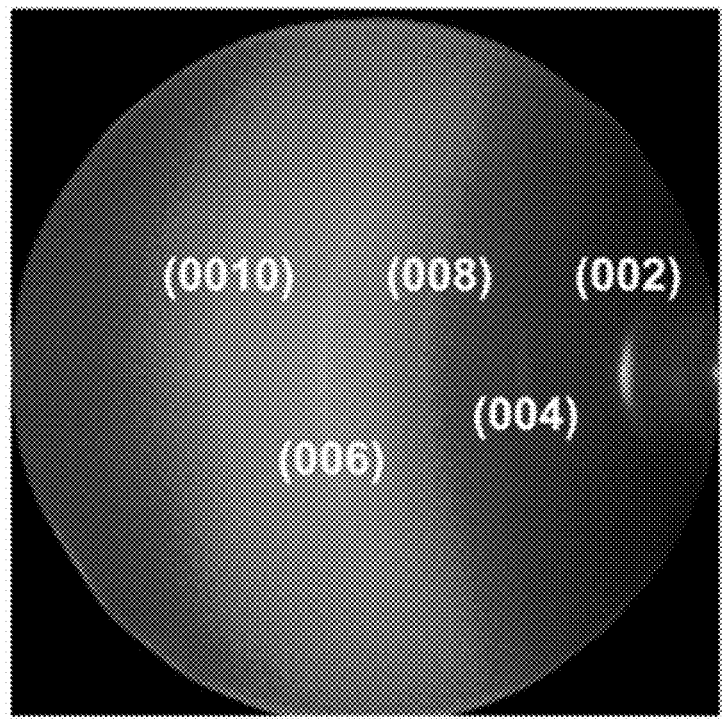
Figure 5E:
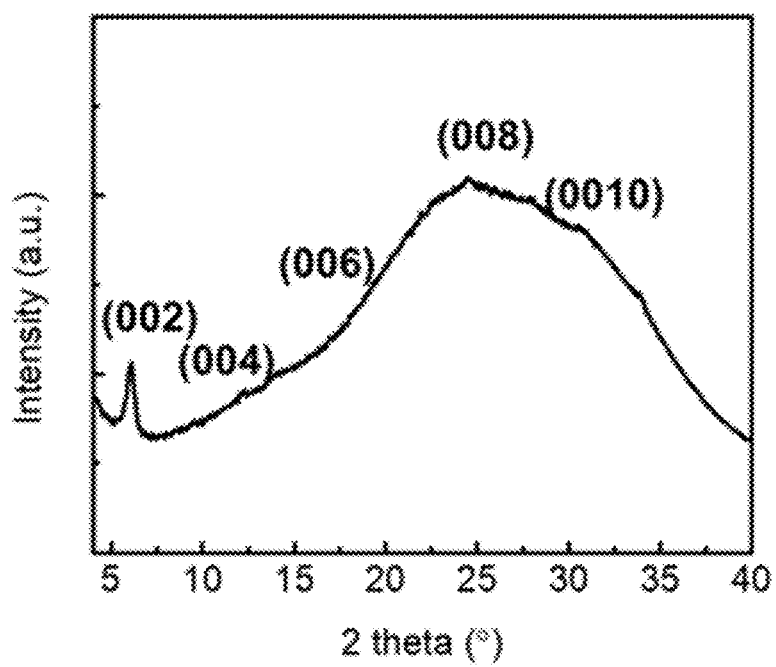
Figure 5F:
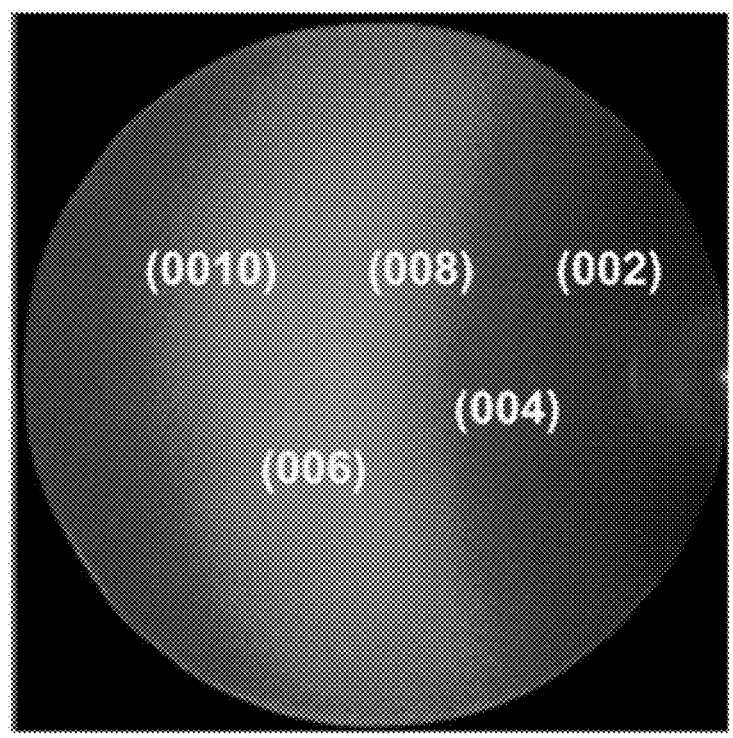
Figure 19:
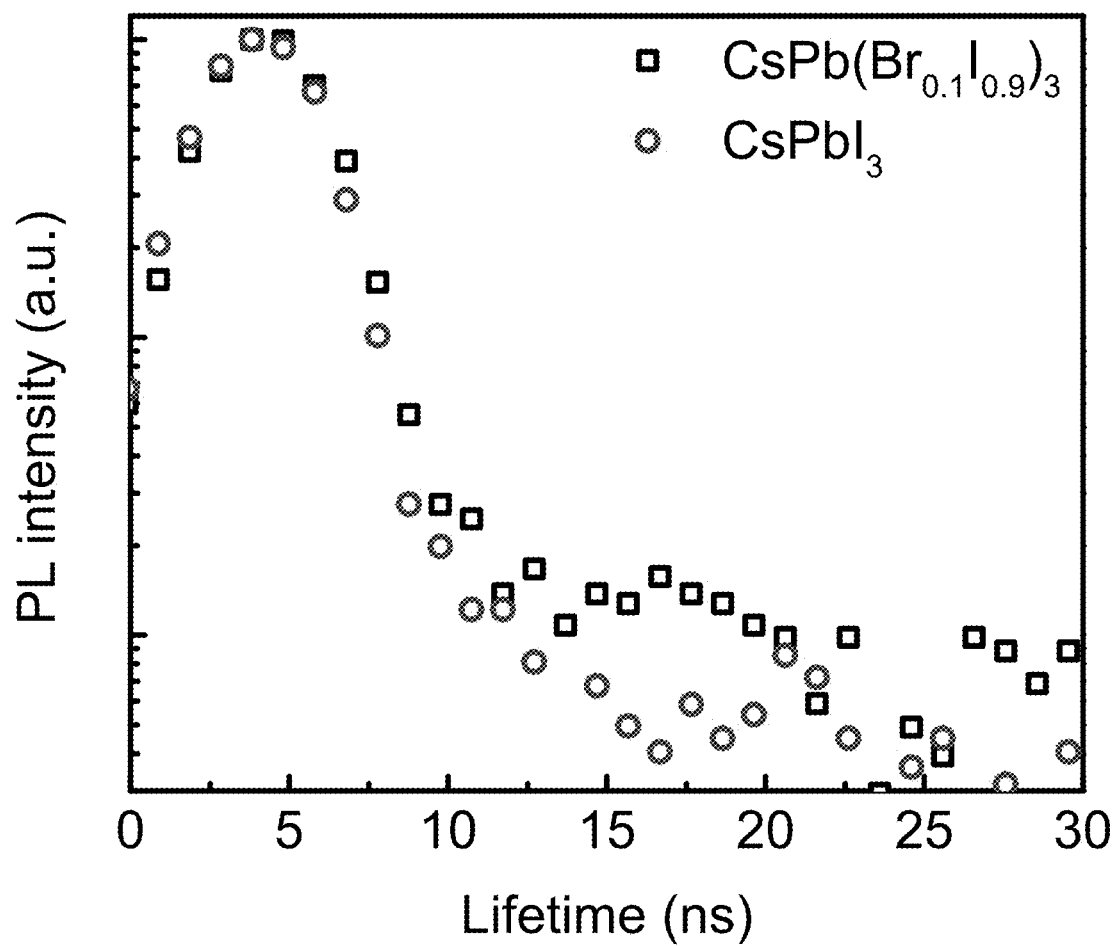
FIG. 19 provides photoluminescence (PL) dynamics of CsPb(Br$_{0.1}$I$_{0.9}$)$_3$ NC and CsPbI$_3$ NC films.

To study the mechanism of enhanced $P_{CP-EL}$ in spin-LEDs based on CISS layer/CsPbBr$_3$ NCs, we compare the electronic spin dynamics and charge carrier dynamics in CsPb (Br$_{0.1}$I$_{0.9}$)$_3$ NC and CsPbI$_3$ NC films. Here, we studied CsPb(Br$_{0.1}$I$_{0.9}$)$_3$ NCs that have the same PL emission wavelength compared to the CP-EL emission of the spin-LEDs based on CISS layer/CsPbBr$_3$ NCs (678 nm) (FIG. 14). In our experiments we measured the spin-coherence lifetime ($\tau_{spin}$) using the technique of circularly polarized pump-probe transmission change at various carrier densities ($n_0$) (FIGS. 17-18); compared to the charge carrier lifetime ($\tau_{carrier}$) measured by time-resolved photoluminescence (TRPL) (FIG. 19). We previously observed that for bulk MAPbBr$_3$ the spin-coherent lifetime was about 3 times longer than that observed for MAPbI$_3$. Other groups have observed a longer spin-lifetime for CsPbBr$_3$ compare to CsPbI$_3$ and ascribed that to an increase in the spin-orbit coupling of the I compared to the Br resulting in a faster spin-flip. Other groups have also reported an intensity dependent spin-carrier lifetime in layered Pb—I based perovskite samples. We also find a carrier density dependent spin-relaxation time. As $n_0$ decreases to $1.7 \times 10^{15}$ cm$^{-3}$ (system limit), CsPb(Br$_{0.1}$I$_{0.9}$)$_3$NC films show gradually increasing $\tau_{spin}$ up to ~14 ps, while CsPbI$_3$ NC films show steady $\tau_{spin}$ of ~4 ps (FIGS. 4B-4D). In the described devices, for a 10 mA cm$^{-2}$ current density the average carrier density within the active area of the device should be ~10$^{14}$ cm$^{-3}$, and for this carrier density the spin-lifetime estimate is ~14 ps. We also find carrier lifetime $\tau_{carrier}$~1.34 ns for the CsPb(Br$_{0.1}$I$_{0.9}$)$_3$ NC films, whereas $\tau_{carrier}$~1.08 ns for the CsPbI$_3$ NC films. The CP-EL efficiency may be approximated by the ratio of the spin-polarization and photoluminescence lifetimes ($\tau_{spin}/\tau_{carrier}$) (41, 42). We find $\tau_{spin}/\tau_{carrier}=1.06 \times 10^{-2}$ in CsPb(Br$_{0.1}$I$_{0.9}$)$_3$ NC films and $\tau_{spin}/\tau_{carrier}=3.5 \times 10^{-3}$ in CsPbI$_3$ NC films (see Table 3), which is in agreement with the measured $P_{CP-EL}$ values in our spin-LEDs, i.e., $\pm 2.6 \times 10^{-2}$ for spin-LEDs based on CsPbBr$_3$ NCs and $\pm 2.5 \times 10^{-3}$ for spin-LEDs based on CsPbI$_3$ NCs.

TABLE 3

Charge carrier lifetime ($\tau_{carrier}$), spin-coherence lifetime ($\tau_{spin}$) measured at carrier density of $1.7 \times 10^{17}$ cm$^{-3}$, $\tau_{spin}/\tau_{carrier}$ and $P_{CP-EL}$ of CsPbI$_3$ NC and CsPb(Br$_{0.1}$I$_{0.9}$)$_3$ NC films.

| Sample | $\tau_{carrier}$ (ns) | $\tau_{spin}$ (ns) | $\tau_{spin}/\tau_{carrier}$ | $P_{CP-EL}$ |
|---|---|---|---|---|
| CsPb(Br$_{0.1}$I$_{0.9}$)$_3$ | 1.34145 | 0.0142 | $1.06 \times 10^{-2}$ | $2.6 \times 10^{-2}$ |
| CsPbI$_3$ | 1.08453 | 0.00386 | $3.5 \times 10^{-3}$ | $2.5 \times 10^{-3}$ |

In summary, described herein is a CP-EL from solution-processed spin-LEDs at room temperature without using a ferromagnetic contact or external magnetic field. Provided is a simple device architecture that: a) injects the spin-polarized holes through the CISS mechanism and generates spin-polarized carriers; b) suppresses the spin-dephasing of spin-polarized carriers in the emitting layer. For the CISS material we used a metal halide perovskite polycrystalline bulk films composed of layered 2D chiral (R-/S-MBA)$_2$PbI$_4$, and for the CP-EL emitting layer we used a pristine (achiral) colloidal perovskite NCs. The perovskite heterostructure films inject spin-polarized hole with $P_{spin}=81\%$ and this leads to selective circularly-polarized light emission with $P_{CP-EL}=\pm 0.25\%$ from the CsPbI$_3$ NCs. $P_{CP-EL}$ was further improved in mixed-halides which suppress the spin-dephasing of spin-polarized carriers, yielding $P_{CP-EL}=\pm 2.6\%$. The obtained spin-LED with CP-EL at room temperature illustrates new opto-spintronic applications.

Methods and Materials

1) Synthesis of (R-/S-/Rac-MBA)$_2$PbI$_4$ Single Crystals

All single crystals were prepared by dissolving 200 mg (0.896 mmol) of PbO and 200 µl (1.57 mmol) of R-, S-, or rac-MBA in 6 ml of 57% HI solution. The precipitates were fully dissolved in solution at 90° C. in oil bath. The solutions were slowly cooled to room temperature under ambient conditions, resulting orange needle-shape crystals. These crystals were vacuum-filtrated, rinsed with diethyl ether and dried in vacuum overnight.

2) Synthesis of Perovskite NCs

In a three-necked round-bottom flask, 1.25 mmol (0.407 g) of Cs$_2$CO$_3$, 1.25 ml OA and 20 ml ODE were degassed under a vacuum at room temperature and 50° C. for 30 min, respectively. The temperature was then increased to 120° C. under N2 and kept at this temperature. In other three-necked round-bottom flask, 1.08 mmol (0.5 g) PbI$_2$ and 25 ml 1-ODE were degassed under vacuum at room temperature and 120° C. for 30 min, respectively. Mixtures of 7.56 mmol (2.5 mL) of OA and OAm were preheated to 120° C., then injected into the PbI$_2$ mixture under vacuum. After PbI$_2$ was fully dissolved, the solution became clear. Then the temperature of the solution was increased to 180° C. under N2 flow. At 180° C., 2 mL of Cs-oleate stock solution was swiftly injected into the PbI$_2$ mixture, which was then quenched by immersing the flask in an ice bath. After cooling to room temperature, 80 mL of methylacetate (MeOAc) was added to the colloidal solution and the solution was centrifuged at 7500 rpm for 5 min to remove unreacted ligands and 1-ODE. The precipitate was dispersed in 10 mL of hexane and then mixed with 20 mL of MeOAc, followed by the centrifugation at 7500 rom for 5 min. The resulting NCs were dispersed in 10 mL of hexane and stored in the refrigerator. For synthesis of CsPbBr$_3$ NCs, 1.08 mmol (0.4 g) PbBr$_2$ was used as a precursor and same synthesis procedure was conducted.

3) Spin-LED Fabrication & Characterization

ITO patterned glasses were cleaned by sequential sonication in acetone and 2-isopropanol for 15 min each, followed by the ultraviolet (UV)-ozone treatment for 10 min. After UV-ozone treatment, modified hole injection layer composed of poly(3,4-ethylenedioxythiophene)/poly(styrene sulfonate) (PEDOT:PSS) and perfluorinated ionomer (PFI) were spin-coated in air to make a 40-nm thickness layer, followed by annealing at 150° C. for 30 min. Then the samples were transferred into a glove box and (R-/S-/rac-MBA)$_2$PbI$_4$ polycrystal films were fabricated by spincoating the (R-/S-/rac-MBA)$_2$PbI$_4$ single crystal-predissolved solution in N,N-dimethylformamide (DMF) (Aldrich®, 99.8%), followed by annealing at 100° C. for 10 min. The samples were transferred to a moisture-controlled N2 flow box and then, emitting layers were formed by spin-coating the perovskite NC solution at 2000 rpm for 25 s. The samples were transferred to a vacuum evaporator, then a 50-nm-thick layer of TPBI, a 1-nm-thick layer of LiF and a 100-nm-thick layer of Al were sequentially deposited. EL efficiencies of fabricated spin-LEDs are measured using a Keithley® 2400 source measurement unit and a calibrated silicon photodiode (Newport 818-SL). External quantum efficiencies of devices were calculated by assuming Lambertian emission profile.

4) Transient Absorption (TA) Spectroscopy on Spin-LED Devices

The transient absorption (TA) measurement is based on the Ti: sapphire laser amplifier (Coherent Astrella®, 800 nm, pulse duration ~60 fs, ~5 mJ/pulse and 1 kHz repetition rate) and the home-built pump-probe setup. The fundamental beam (800 nm) is split into two beams. One beam is sent to an optical parametric amplifier (OPA) to generate the pump pulse with tunable wavelength, and its intensity is attenuated by two neutral density filter wheels. The other 800 nm beam was focused into a sapphire to generate white light probe. The time delay between pump and probe is tuned by a delay line. The pump and probe are focused and overlapped onto the sample. The beam size is defined as the radius of an aperture that contains 1/e$^2$ of the total power. The probe and pump beams are around 200 µm and 600 µm, respectively. The pump beam incident normally to the sample and the probe beam incident 45 degree to the sample. The TA of the spin-LED devices were operated at a reflective mode because of the opaque electrodes. Since the penetration depth of both pump and probe are larger than the film thickness, the measured transient reflection (TR), however is the change of the absorption in the bulk film, namely TA. The samples all were measured under ambient conditions.

5) Spin Depolarization Measurement on Perovskite Thin Films

The spin depolarization measurement is based on the transient absorption (TA) setup described above but operated in transmissive geometry. Circularly polarized pump pulse is derived by putting the linearly polarized pump pulse through a quarter waveplate (Thorlabs). The fast axis of the quarter waveplate is set at 45 or −45 degree to the polarization of the linearly pump beam to ensure a left or right circularly polarized excitation. The circularly polarized probe beam is realized by passing the 800 nm fundamental probe light through a quarter waveplate (Thorlabs) and generating the circularly polarized white light continuum. Other parameters are kept the same with TA measurement described above.

6) Carrier Density Calculation

For a typical measurement, the initial charge carrier density equals the absorbed photon number and can be obtained from the following equation, $$N_0 = \frac{E \times e^{-A}}{E_{photon} \times \pi \times \left(\frac{d}{2}\right)^2 \times l}$$

where E is the pump energy per pulse, A is the absorbance of the film at the selected wavelength and measured by linear absorption spectroscopy, $E_{photon}$ is the photon energy at the pump wavelength, d is the diameter of the pump beam, and l is the penetration depth or the film thickness whichever is smaller.

The described invention may be further understood by the following non-limiting examples:

Example 1. A light emitting diode comprising:
a perovskite conductive layer comprising stereochemically-selected cations, wherein said stereochemically-selected cations enable a spin-polarized light emitting diode capable of generating a circularly-polarized electroluminescence.

Example 2. The light emitting diode of example 1 further comprising a perovskite nanocrystal emitting layer in electronic communication with said perovskite conductive layer.

Example 3. The light emitting diode of example 1 or 2 further comprising an anode layer in electronic communication with said perovskite conductive layer.

Example 4. The light emitting diode of any of examples 1-3 further comprising a cathode layer in electronic communication with said perovskite nanocrystal emitting layer.

Example 5. The light emitting diode of any of examples 1-4, wherein said perovskite conductive layer comprises a metal-halide perovskite.

Example 6. The light emitting diode of any of examples 1-5, wherein said perovskite conductive layer comprises lead iodide.

Example 7. The light emitting diode of any of examples 1-6, wherein said stereochemically-selected cations comprise R or S organic molecules.

Example 8. The light emitting diode of any of examples 1-7, wherein said stereochemically-selected cations comprise R or S methylbenzylammonium.

Example 9. The light emitting diode of any of examples 1-8, wherein at least 75% of said stereochemically-selected cations are the same enantiomer.

Example 10. The light emitting diode of any of examples 1-9, wherein said perovskite conductive layer is solution processed.

Example 11. The light emitting diode of any of examples 2-10, wherein said perovskite nanocrystal emitting layer comprises nanocrystals with an average diameter less than or equal to 25 nm.

Example 12. The light emitting diode of any of examples 2-11, wherein said perovskite nanocrystal emitting layer comprises CsPbI nanocrystals, CsPbBr nanocrystals or a combination thereof.

Example 13. The light emitting diode of any of examples 2-12, wherein said perovskite nanocrystal emitting layer is deposited on a surface of said perovskite conductive layer via spin coating.

Example 14. The light emitting diode of any of examples 3-13, wherein said perovskite conductive layer is deposited on a surface of said anode layer via spin coating.

Example 15. The light emitting diode of example 14, wherein said perovskite conductive layer is deposited on a surface of said anode layer to form a horizontally oriented organic/inorganic multiple quantum well configuration.

Example 16. The light emitting diode of any of examples 3-15, wherein said anode layer comprises indium tin oxide (ITO).

Example 17. The light emitting diode of any of examples 3-16, wherein said anode layer comprises modified poly(3,4-ethylenedioxythiophene) polystyrenesulfonate.

Example 18. The light emitting diode of any of examples 3-17, wherein said anode layer comprises a perfluorinated polymeric ionomer.

Example 19. The light emitting diode of any of examples 4-18, wherein said cathode layer comprises LiF.

Example 20. The light emitting diode of any of examples 4-19, wherein said cathode layer comprises Al.

Example 21. The light emitting diode of any of examples 1-20, wherein said spin-polarized light emitting diode generates circularly-polarized electroluminescence at 25° C.

Example 22. The light emitting diode of any of examples 1-21, wherein said spin-polarized light emitting diode generates circularly-polarized electroluminescence without application of a magnetic field or ferromagnetic contacts.

Example 23. The light emitting diode of any of examples 1-22 further comprising an additive layer comprising 2,2',2-(1,3,5-benzinetriyl)-tris(1-phenyl-1-H-benzimidazole) (TPBI).

Example 24. The light emitting diode of any of examples 1-23, wherein said spin polarized light emitting diode achieves a circularly-polarized electroluminescence having polarization greater than or equal to ±1.0%.

Example 25. A light emitting diode comprising:
a metal-halide perovskite conductive layer comprising stereochemically-selected cations;
a perovskite nanocrystal emitting layer in electronic communication with said metal-halide perovskite layer;
an anode layer in electronic communication with said metal-halide perovskite layer; and
a cathode layer in electronic communication with said perovskite nanocrystal emitting layer.

Example 26. The light emitting diode of example 25, wherein said stereochemically-selected cations enable a spin-polarized light emitting diode capable of generating a circularly-polarized electroluminescence.

Example 27. A method of making any of the light emitting diodes of claims 1-26.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods, and devices useful for the present methods can include a large number of optional composition and processing elements and steps.

As used herein and in the appended claims, the singular forms "a", "an", and "the" include plural reference unless the context clearly dictates otherwise. Thus, for example, reference to "a cell" includes a plurality of such cells and equivalents thereof known to those skilled in the art. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

When a group of substituents is disclosed herein, it is understood that all individual members of that group and all subgroups, are disclosed separately. When a Markush group or other grouping is used herein, all individual members of the group and all combinations and subcombinations possible of the group are intended to be individually included in the disclosure. For example, when a device is set forth disclosing a range of materials, device components, and/or device configurations, the description is intended to include specific reference of each combination and/or variation corresponding to the disclosed range.

Every formulation or combination of components described or exemplified herein can be used to practice the invention, unless otherwise stated.

Whenever a range is given in the specification, for example, a density range, a number range, a temperature range, a time range, or a composition or concentration range, all intermediate ranges, and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A light emitting diode comprising:
   a perovskite conductive layer comprising stereochemically-selected cations, wherein said stereochemically-selected cations enable a spin-polarized light emitting diode capable of generating a circularly-polarized electroluminescence;
   a perovskite nanocrystal emitting layer in electronic communication with said perovskite conductive layer;
   wherein said perovskite nanocrystal emitting layer comprises CsPbI nanocrystals, CsPbBr nanocrystals or a combination thereof.

2. The light emitting diode of claim 1 further comprising an anode layer in electronic communication with said perovskite conductive layer.

3. The light emitting diode of claim 1 further comprising a cathode layer in electronic communication with said perovskite nanocrystal emitting layer.

4. The light emitting diode of claim 1, wherein said perovskite conductive layer comprises a metal-halide perovskite.

5. The light emitting diode of claim 1, wherein said perovskite conductive layer comprises lead iodide.

6. The light emitting diode of claim 1, wherein said stereochemically-selected cations comprise R or S organic molecules.

7. The light emitting diode of claim 1, wherein said stereochemically-selected cations comprise R or S methylbenzylammonium.

8. The light emitting diode of claim 1, wherein at least 75% of said stereochemically-selected cations are the same enantiomer.

9. The light emitting diode of claim 1, wherein said perovskite conductive layer is solution processed.

10. The light emitting diode of claim 1, wherein said perovskite nanocrystal emitting layer comprises nanocrystals with an average diameter less than or equal to 25 nm.

11. The light emitting diode of claim 1, wherein said perovskite nanocrystal emitting layer is deposited on a surface of said perovskite conductive layer via spin coating.

12. The light emitting diode of claim 2, wherein said perovskite conductive layer is deposited on a surface of said anode layer via spin coating.

13. The light emitting diode of claim 12, wherein said perovskite conductive layer is deposited on a surface of said anode layer to form a horizontally oriented organic/inorganic multiple quantum well configuration.

14. The light emitting diode of claim 1, wherein said spin-polarized light emitting diode generates circularly-polarized electroluminescence at 25° C.

15. The light emitting diode of claim 1, wherein said spin-polarized light emitting diode generates circularly-polarized electroluminescence without application of a magnetic field or ferromagnetic contacts.

16. The light emitting diode of claim 1, wherein said spin polarized light emitting diode achieves a circularly-polarized electroluminescence having polarization greater than or equal to ±1.0%.

17. A light emitting diode comprising:
a metal-halide perovskite conductive layer comprising stereochemically-selected cations;
a perovskite nanocrystal emitting layer in electronic communication with said metal-halide perovskite layer;
an anode layer in electronic communication with said metal-halide perovskite layer; and
a cathode layer in electronic communication with said perovskite nanocrystal emitting layer;
wherein said perovskite nanocrystal emitting layer comprises CsPbI nanocrystals, CsPbBr nanocrystals or a combination thereof.

18. The light emitting diode of claim 17, wherein said stereochemically-selected cations enable a spin-polarized light emitting diode capable of generating a circularly-polarized electroluminescence.

* * * * *